United States Patent
Choi et al.

(10) Patent No.: US 11,503,192 B2
(45) Date of Patent: Nov. 15, 2022

(54) IMAGING DEVICE AND IMAGE SENSING METHOD

(71) Applicant: SAMSUNG ELECTRONICS CO., LTD., Suwon-si (KR)

(72) Inventors: Kyuhwan Choi, Yongin-si (KR); Yang Ho Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 16/918,616

(22) Filed: Jul. 1, 2020

(65) Prior Publication Data
US 2021/0195072 A1 Jun. 24, 2021

(30) Foreign Application Priority Data
Dec. 24, 2019 (KR) .................. 10-2019-0174035

(51) Int. Cl.
H04N 5/225 (2006.01)
G02B 19/00 (2006.01)
H01L 27/146 (2006.01)
G02B 7/02 (2021.01)

(52) U.S. Cl.
CPC ........... H04N 5/2254 (2013.01); G02B 7/021 (2013.01); G02B 19/0004 (2013.01); H01L 27/14627 (2013.01)

(58) Field of Classification Search
CPC .. H04N 5/2254; H04N 5/2257; H04N 5/2253; G02B 7/021; G02B 19/0004; G02B 3/0056; G02B 3/0062; G02B 13/001; H01L 27/14627
See application file for complete search history.

(56) References Cited

U.S. PATENT DOCUMENTS

| 7,009,652 B1 | 3/2006 | Tanida et al. |
| 7,412,107 B2 | 8/2008 | Milanfar et al. |
| 7,724,439 B2 | 5/2010 | Li et al. |
| 7,940,282 B2 | 5/2011 | Milanfar et al. |
| 8,237,841 B2 | 8/2012 | Tanida et al. |

(Continued)

FOREIGN PATENT DOCUMENTS

| EP | 3007228 A1 | 4/2016 |
| JP | 2009003809 A | 1/2009 |

(Continued)

OTHER PUBLICATIONS

Communication dated Feb. 26, 2021 issued by the European Patent Office in application No. 20191920.6.

*Primary Examiner* — Abdelaaziz Tissire
(74) *Attorney, Agent, or Firm* — Sughrue Mion, PLLC

(57) ABSTRACT

Provided is an imaging device including a sensing array including a plurality of sensing elements, an imaging lens array including a plurality of imaging optical lenses, each of the plurality of imaging optical lenses having a non-circular cross-section perpendicular to an optical axis, and configured to transmit light received from an outside of the imaging device, and a condensing lens array including a plurality of condensing lenses disposed between the imaging lens array and the sensing array, and configured to transmit the light passing through the imaging lens array to the sensing elements, wherein a number of the plurality of imaging optical lenses is less than a number of the plurality of condensing lenses.

52 Claims, 15 Drawing Sheets

(56) References Cited

U.S. PATENT DOCUMENTS

| | | | |
|---|---|---|---|
| 9,485,397 B2 | 11/2016 | Rudmann et al. | |
| 9,578,237 B2 | 2/2017 | Duparre et al. | |
| 2004/0179834 A1* | 9/2004 | Szajewski | G02B 3/0056 |
| | | | 348/E5.026 |
| 2005/0052751 A1* | 3/2005 | Liu | G02B 6/4249 |
| | | | 257/E31.128 |
| 2007/0030379 A1* | 2/2007 | Agranov | H04N 5/3572 |
| | | | 348/E5.079 |
| 2007/0091197 A1* | 4/2007 | Okayama | G02B 3/0056 |
| | | | 348/340 |
| 2007/0153107 A1 | 7/2007 | Boettiger et al. | |
| 2007/0206241 A1* | 9/2007 | Smith | H01L 27/14623 |
| | | | 348/E3.032 |
| 2008/0080028 A1* | 4/2008 | Bakin | G06T 1/0007 |
| | | | 358/514 |
| 2009/0140131 A1* | 6/2009 | Utagawa | H04N 9/04515 |
| | | | 250/578.1 |
| 2009/0185289 A1* | 7/2009 | Do | G02B 13/0035 |
| | | | 359/716 |
| 2010/0321564 A1 | 12/2010 | Feldman et al. | |
| 2011/0057277 A1* | 3/2011 | Yu | H01L 27/14629 |
| | | | 257/E31.127 |
| 2011/0122308 A1 | 5/2011 | Duparre | |
| 2011/0284725 A1* | 11/2011 | Goldberg | G02B 3/0012 |
| | | | 250/208.2 |
| 2013/0033636 A1* | 2/2013 | Pitts | H04N 13/229 |
| | | | 348/340 |
| 2016/0134813 A1* | 5/2016 | Hu | H04N 5/23287 |
| | | | 348/208.11 |
| 2016/0154198 A1* | 6/2016 | Alasimio | G02B 7/021 |
| | | | 348/335 |
| 2016/0202475 A1* | 7/2016 | Toda | H01L 27/14627 |
| | | | 359/809 |
| 2017/0078568 A1 | 3/2017 | Venkataraman et al. | |
| 2017/0111558 A1 | 4/2017 | Brueckner et al. | |
| 2018/0152692 A1 | 5/2018 | Cho et al. | |
| 2019/0164255 A1 | 5/2019 | Cho et al. | |

FOREIGN PATENT DOCUMENTS

| | | |
|---|---|---|
| JP | 2009065595 A | 3/2009 |
| JP | 2009176857 A | 8/2009 |
| JP | 2012100204 A | 5/2012 |
| JP | 2013258602 A | 12/2013 |
| JP | 2015060068 A | 3/2015 |
| JP | 6524357 B1 | 6/2019 |
| KR | 1020070092285 A | 9/2007 |
| KR | 1020100067543 A | 6/2010 |
| WO | 2004027880 A2 | 4/2004 |
| WO | 2011045324 A2 | 4/2011 |
| WO | 2014024745 A1 | 2/2014 |

* cited by examiner

IMAGING DEVICE AND IMAGE SENSING METHOD

CROSS-REFERENCE TO RELATED APPLICATION

This application claims priority from Korean Patent Application No. 10-2019-0174035, filed on Dec. 24, 2019 in the Korean Intellectual Property Office, the disclosure of which is incorporated herein by reference in its entirety.

BACKGROUND

1. Field

Methods and apparatuses consistent with exemplary embodiments relate to technology related to an imaging device.

2. Description of Related Art

Due to the development of optical technology and image processing technology, capturing devices are utilized in a wide range of fields such as multimedia contents, security, and recognition. For example, a capturing device may be mounted on a mobile device, a camera, a vehicle, or a computer to capture an image, recognize an object, or obtain data for controlling the device. The volume of the capturing device may be determined by the size of a lens, the focal length of the lens, and the size of a sensor. To reduce the volume of the capturing device, multiple lenses including small lenses may be used.

SUMMARY

One or more exemplary embodiments may address at least the above problems and/or disadvantages and other disadvantages not described above. Also, the exemplary embodiments are not required to overcome the disadvantages described above, and an exemplary embodiment may not overcome any of the problems described above.

According to an aspect of an example embodiment, there is provided an imaging device including a sensing array including a plurality of sensing elements, an imaging lens array including a plurality of imaging optical lenses, each of the plurality of imaging optical lenses having a non-circular cross-section perpendicular to an optical axis, and configured to transmit light received from an outside of the imaging device, and a condensing lens array including a plurality of condensing lenses disposed between the imaging lens array and the sensing array, and configured to transmit the light passing through the imaging lens array to the sensing elements, wherein a number of the plurality of imaging optical lenses is less than a number of the plurality of condensing lenses.

The imaging device may further include an additional optical lens array including a plurality of additional optical lenses, each of the plurality of additional optical lenses having one of a circular cross-section and a non-circular cross-section perpendicular to the optical axis, the additional optical lens array and the sensing array being respectively disposed on opposite sides of the imaging lens array.

The imaging lens array may be disposed closer to the condensing lens array than the additional optical lens array.

The imaging device may further include an aperture configured to transmit the light, the aperture and the sensing array being respectively disposed on opposite sides of the imaging lens array.

The sensing array may include a sensing region that includes a portion of the sensing elements of the plurality of sensing elements, the sensing region being configured to receive the light from the plurality of imaging optical lenses and being rectangular, and the cross-section of each of the plurality of imaging optical lenses may correspond to a portion of a circular lens having a diameter greater than a length of a short side of the rectangular sensing region.

Each of the plurality of imaging optical lenses may correspond to the circular lens with a portion where the diameter of the circular lens is greater than the length of the short side of the rectangular sensing region is cut off.

Each of the plurality of imaging optical lenses may be configured to intersect with virtual straight lines from edge points of an aperture to a boundary of a sensing region.

At an outer portion of each of the plurality of imaging optical lenses, a first refraction angle of a first ray incident parallel with a virtual straight line from a center of each of the plurality of imaging optical lenses to a boundary of a sensing region may be equal to a second refraction angle of a second ray incident parallel with the principle optical axis of each of the plurality of imaging optical lenses.

A difference between a first light path along which the first ray reaches the sensing array and a second light path along which the second ray reaches the sensing array may be less than a threshold path difference.

The imaging device may further include a processor configured to generate an image based on sensing information sensed by the sensing array.

According to another aspect of an example embodiment, there is provided an imaging device including an imaging optical lens having a non-circular cross-section perpendicular to an optical axis, the imaging optical lens configured to transmit light received from an outside of the imaging device, and a sensing array including a plurality of sensing elements, the sensing array configured to sense the light passing through the imaging optical lens through a sensing element among the plurality of sensing elements included in a sensing region, wherein the imaging optical lens and the sensing array are disposed in a fractional alignment structure.

The imaging device may further include an additional optical lens having one of a circular cross-section and a non-circular cross-section perpendicular to the optical axis, the additional optical lens and the sensing array respectively being disposed on opposite sides of the imaging optical lens.

The imaging optical lens may be closer to an image sensor including a condensing microlens and the sensing array than the additional optical lens.

The imaging device may further include an aperture configured to transmit the light, the aperture and the sensing array being respectively disposed on opposite sides of the imaging optical lens.

The sensing array may include a sensing region that includes a portion of the sensing elements of the plurality of sensing elements, the sensing region being configured to receive the light from the imaging optical lens and being rectangular, and the cross-section of the imaging optical lens may correspond to a portion of a circular lens with a diameter greater than a length of a short side of the rectangular sensing region.

The imaging optical lens may correspond to the circular lens with a portion where the diameter of circular lens is greater than the length of the short side of the rectangular sensing region is cut off.

The portion may be outside of the rectangular sensing region corresponding to the imaging optical lens.

The non-circular cross-section of the imaging optical lens may include two arcs and two straight lines respectively connecting ends of the two arcs.

The non-circular cross-section of the imaging optical lens may include four arcs and four straight lines respectively connecting ends of the four arcs.

The non-circular cross-section of the imaging optical lens may correspond to a portion of a circle with a diameter greater than or equal to a diagonal length of the sensing region.

The non-circular cross-section of the imaging optical lens may be quadrangular.

The imaging optical lens may be configured to intersect with virtual lines from edge points of an aperture to a boundary of the sensing region.

At an outer portion of the imaging optical lens, a first refraction angle of a first ray incident parallel with a virtual straight line from a center of the imaging optical lens to a boundary of the sensing region may be equal to a second refraction angle of a second ray incident parallel with the optical axis of the imaging optical lens.

A difference between a first light path along which the first ray reaches the sensing array and a second light path along which the second ray reaches the sensing array may be less than a threshold path difference.

A proportion of a cross-sectional area of the non-circular imaging optical lens to an area of the sensing region may be greater than 0.78 and less than or equal to 1.

A proportion of the non-circular cross-sectional area of the imaging optical lens to an area of the sensing region may be greater than 0.58 and less than or equal to 1.

A proportion of the non-circular cross-sectional area of the imaging optical lens to an area of the sensing region may be greater than 0.44 and less than or equal to 1.

A proportion of the non-circular cross-sectional area of the imaging optical lens to an area of the sensing region may be greater than 0.39 and less than or equal to 1.

A proportion of the non-circular cross-sectional area of the imaging optical lens to an area of the sensing region may be greater than 0.89 and less than or equal to 1.

The imaging device may further include a lens array including a plurality of non-circular imaging optical lenses.

The imaging device may further include a processor configured to generate an image based on sensing information sensed by the sensing array.

The imaging device may further include a lens array including an additional imaging optical lens having a same shape and a same size as the imaging optical lens, wherein the imaging optical lens and the additional imaging optical lens may be disposed along a same plane.

The fractional alignment structure may be a structure in which the sensing region includes a non-integer number of sensing elements.

According to another aspect of an example embodiment, there is provided an imaging device including an imaging lens array including a plurality of non-circular imaging optical lenses, each of the plurality of non-circular imaging optical lenses being configured to transmit light received from an outside of the imaging device, and a sensing array including a plurality of sensing regions, each of the plurality of sensing regions configured to sense the light passing through the plurality of imaging optical lenses, the plurality of sensing regions each including a plurality of sensing elements.

Each of the plurality of sensing regions may include four or more sensing elements.

Each of the plurality of sensing regions may include nine or more sensing elements.

The imaging device may further include an aperture configured to transmit the light, the aperture and the sensing array respectively being disposed on opposite sides of the imaging lens array.

The imaging device may further include a filter disposed between the imaging lens array and the sensing array and configured to block a portion of wavelengths of the light passing therethrough.

The imaging device may further include an additional optical lens having one of a circular cross-section and a non-circular cross-section perpendicular to the optical axis of the imaging device, the additional optical lens and the sensing array being respectively disposed on opposite sides of the imaging lens array.

The imaging device may further include a processor configured to generate an image based on sensing information sensed by the sensing array.

A proportion of a cross-sectional area of the non-circular imaging optical lens to an area of the sensing elements may range from 0.78 to 1.0.

The imaging device may further include a condensing lens array including a plurality of condensing lenses disposed between the imaging lens array and the sensing array, and may be configured to transmit the light passing through the imaging lens array to the sensing array.

A number of the plurality of condensing lenses may be greater than a number of the plurality of non-circular imaging optical lenses.

According to an aspect of an example embodiment, there is provided a mobile terminal including an image sensing assembly configured to receive external light through a non-circular imaging optical lens and generate sensing information based on sensing the external light through a plurality of sensing elements, a processor configured to reconstruct an output image based on the sensing information, and a memory configured to store at least one of the sensing information and the output image.

The image sensing assembly may further include a plurality of condensing lenses disposed between the non-circular imaging optical lens and the plurality of sensing elements, and configured to transmit the light passing through the non-circular imaging optical lens to the plurality of sensing elements.

The non-circular imaging optical lens may be disposed closest to the plurality of condensing lenses.

The mobile terminal may further include a sensing region that may include a plurality of sensing elements, the sensing region being configured to receive light from the non-circular imaging optical lens, and the sensing region being rectangular, and a cross-section of the non-circular imaging optical lens may correspond to a portion of a circle with a diameter greater than a length of a short side of the rectangular sensing region.

The non-circular imaging optical lens may correspond to a portion of a circular lens with the diameter greater than the length of the short side of the rectangular sensing region being cut off.

According to an aspect of an example embodiment, there is provided an imaging device including a sensing array including a plurality of sensing elements and a sensing region including a portion of the plurality of sensing elements, an imaging lens array including a plurality of imaging optical lenses, each of the plurality of imaging optical lenses having a non-circular cross-section perpendicular to an optical axis, and configured to transmit light received from an outside of the imaging device, a condensing lens array including a plurality of condensing lenses disposed between the imaging lens array and the sensing array, and configured to transmit the light passing through the imaging lens array to the sensing elements, an additional optical lens array including a plurality of additional optical lenses and disposed on the imaging lens array opposite to the sensing array, wherein the non-circular cross-section of each of the plurality of imaging optical lenses corresponds to a circular lens with a portion where a diameter of the circular lens is greater than a length of a short side of the rectangular sensing region being cut off.

According to another aspect of an example embodiment, there is provided an image sensing method including receiving light passing through an imaging optical lens having a non-circular cross-section perpendicular to a principal axis in a sensing area corresponding to the imaging optical lens in a sensing array, and generating sensing information related to the sensing region by sensing the light passing through the imaging optical lens.

The receiving may include receiving a first ray at a boundary of the sensing region, the first ray incident parallel with a virtual straight line from a center of the imaging optical lens to the boundary of the sensing region and refracted by an outer portion of the imaging optical lens at a first refraction angle, and receiving a second ray at a center of the sensing region, the second ray incident parallel with an optical axis of the imaging optical lens and refracted by the outer portion of the imaging optical lens at a second refraction angle which is similar to the first refraction angle.

A difference between a first light path along which the first ray reaches the boundary of the sensing region and a second light path along which the second ray reaches the center of the sensing region may be less than a threshold path difference.

The receiving may include receiving rays passing through different imaging optical lenses by at least one sensing element of the sensing array.

The generating may include, for sensing regions respectively corresponding to a plurality of imaging optical lenses, sensing intensity values of light reaching sensing elements belonging to the corresponding sensing regions.

The image sensing method may further include reconstructing images respectively corresponding to the plurality of imaging optical lenses based on the sensed intensity values.

BRIEF DESCRIPTION OF THE DRAWINGS

The above and/or other aspects will be more apparent by describing exemplary embodiments with reference to the accompanying drawings, in which.

DETAILED DESCRIPTION

Figure 1A:
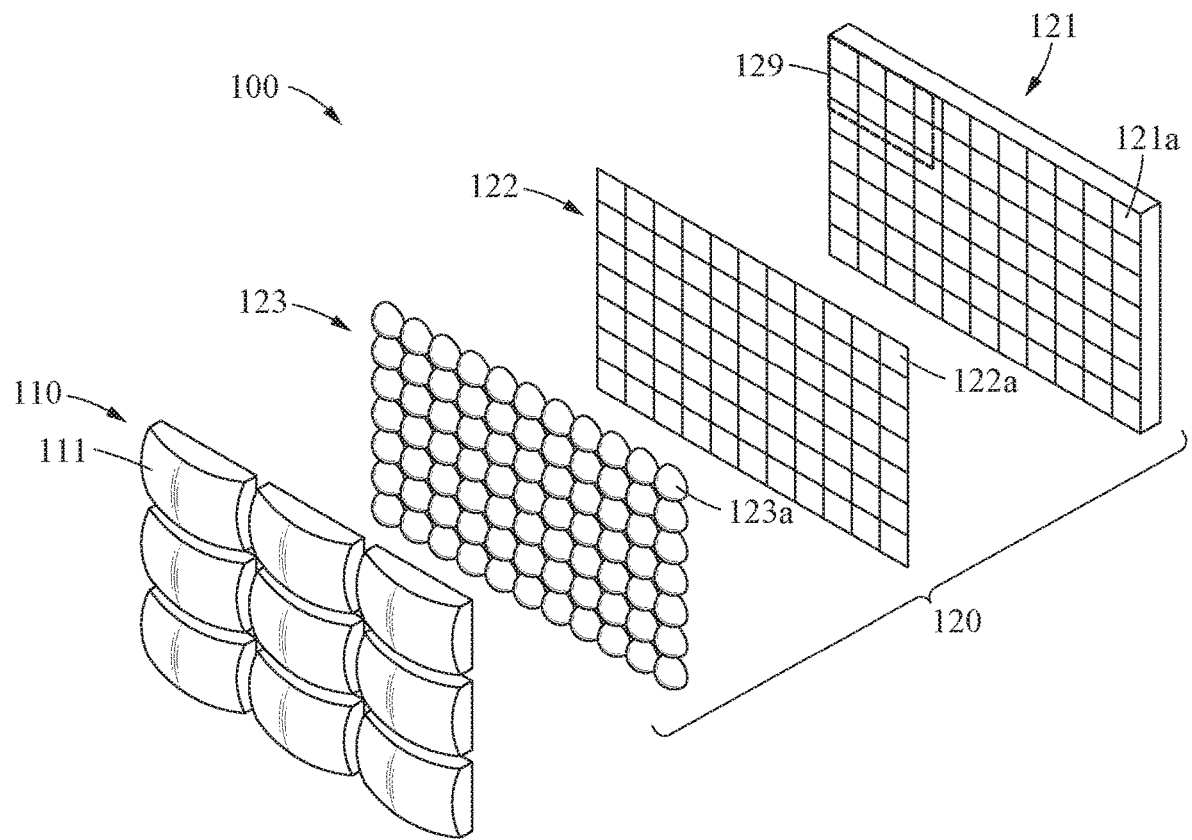
FIGS. 1A and 1B illustrate a structure of an imaging device according to an exemplary embodiment.

Hereinafter, some exemplary embodiments will be described in detail with reference to the accompanying drawings. However, various alterations and modifications may be made to the exemplary embodiments. Here, the exemplary embodiments are not construed as limited to the disclosure and should be understood to include all changes, equivalents, and replacements within the idea and the technical scope of the disclosure.

The terminology used herein is for the purpose of describing particular exemplary embodiments only and is not to be limiting of the exemplary embodiments. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Unless otherwise defined, all terms including technical and scientific terms used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the exemplary embodiments with reference to the accompanying drawings, like reference numerals refer to like constituent elements and a repeated description related thereto will be omitted. In the description of exemplary embodiments, detailed description of well-known related structures or functions will be omitted when it is deemed that such description will cause ambiguous interpretation of the present disclosure.

Figure 1B:
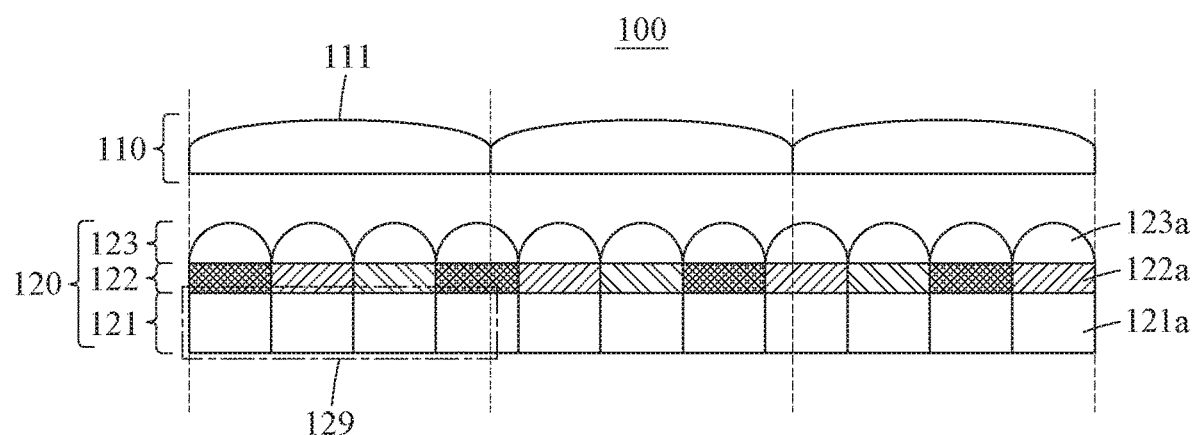

FIGS. 1A and 1B illustrate a structure of an imaging device according to an exemplary embodiment. FIG. 1A is a perspective view of the imaging device, and FIG. 1B is a cross-sectional view of the imaging device.

Referring to FIGS. 1A and 1B, an imaging device 100 includes a lens array 110 and an image sensor 120. The lens array 110 includes lens elements, and the image sensor 120 includes sensing elements. The lens elements may be disposed along a plane of the lens array 110, and the sensing elements may be disposed along a plane of a sensing array 121 in the image sensor 120. The plane of the lens array 110 may be parallel with the plane of the sensing array 121. The lens array 110 may be a micro multi-lens array (MMLA) for imaging and also be an imaging lens array.

The image sensor 120 may include the sensing array 121, an optical filter 122, and a condensing lens array 123. According to an exemplary embodiment, when the image sensor 120 does not include the optical filter 122, an individual condensing microlens 123a of the condensing lens array 123 may be configured to have an optical characteristic of transmitting a predetermined wavelength band and blocking the remaining wavelength bands other than the predetermined wavelength band.

The condensing lens array 123 may include a plurality of condensing microlenses configured to concentrate light passing through the lens array 110 on the sensing array 121. For example, the number of condensing microlenses included in the condensing lens array 123 may be equal to the number of sensing elements included in the sensing array 121. The plurality of condensing microlenses may be disposed between imaging optical lenses and the sensing array 121 to transmit light passing through the imaging optical lenses to the sensing elements 121a corresponding to the respective condensing microlenses 123a by concentrating the light on the sensing elements 121a. For example, as shown in FIG. 1B, a condensing microlens 123a may be disposed above each sensing element 121a of the sensing array 121 to concentrate light on the sensing element 121a disposed thereunder. Further, as shown in FIG. 1B, a color filter 122a may be disposed between each condensing microlens 123a and each sensing element 121a.

The optical filter 122 may be a filter having an optical characteristic of transmitting a predetermined wavelength band and blocking the remaining wavelength bands. For example, the optical filter 122 may be implemented as a color filter array (CFA) including a plurality of color filters disposed along a filter plane. Each color filter 122a may be a filter that transmits light of a wavelength band corresponding to a predetermined color and blocks light of the remaining wavelength bands other than the predetermined color. For example, the color filter 122a may include a red-pass filter, a green-pass filter, and a blue-pass filter. The red-pass filter may transmit light of a wavelength band corresponding to red and blocks light of the remaining wavelength bands other than the wavelength band corresponding to red. The green-pass filter may transmit light of a wavelength band corresponding to green and blocks light of the remaining wavelength bands other than the wavelength band corresponding to green. The blue-pass filter may transmit light of a wavelength band corresponding to blue and blocks light of the remaining wavelength bands other than the wavelength band corresponding to blue. In the CFA, the color filters that respectively transmit color lights may be disposed in a Bayer pattern or another pattern. The optical filter 122 may also be an infrared cut-off filter that transmits a visible light band and blocks an infrared band.

The quality of an image captured and reconstructed by the image sensor 120 may be determined by the number of sensing elements included in the sensing array 121 and an intensity of light incident to the sensing elements 121a. For example, the resolution of an image may be determined by the number of sensing elements included in the sensing array 121, the sensitivity of the image may be determined by the intensity of light incident on the sensing elements 121a, and the intensity of incident light may be determined by the size of the sensing elements 121a. As the size of the sensing elements 121a increases, the intensity of light may increase, and the dynamic range of the sensing array 121 may increase. Thus, as the number of sensing elements included in the sensing array 121 increases, the image sensor 120 may capture a higher-resolution image, and as the size of the sensing elements 121a increases, the image sensor 120 may operate more advantageously in capturing a high-sensitivity image in a low luminance environment.

The volume of the imaging device 100 may be determined by a focal length of a lens element 111. In detail, the volume of the imaging device 100 may be determined by a gap between the lens element 111 and the sensing array 121. That is because the image sensor 120 needs to be spaced apart from the lens element 111 by a distance corresponding to the focal length of the lens element 111 to collect light refracted by the lens element 111. Thus, the plane of the lens array 110 may be spaced apart from the image sensor 120 by the distance corresponding to the focal length of the lens element 111 included in the lens array 110. The focal length of the lens element 111 is determined by a field of view (FoV) of the imaging device 100 and the size of the lens element 111. If the FoV is fixed, the focal length increases in proportion to the size of the lens element 111. To capture an image of a predetermined range of FoV, the size of the lens element 111 needs to be increased as the size of the sensing array 121 increases.

According to the above description, in order to increase the sensitivity of an image while maintaining the FoV and the resolution of the image, the volume of the image sensor 120 increases. For example, to increase the sensitivity of an image while maintaining the resolution of the image, the size of each sensing element needs to be increased while maintaining the number of sensing elements included in the sensing array 121, and thus the size of the sensing array 121 increases. In this example, to maintain the FoV, the size of the lens element 111 increases and the focal length of the lens element 111 increases as the size of the sensing array 121 increases, and thus the volume of the image sensor 120 increases.

According to the exemplary embodiment, as the size of each lens element included in the lens array 110 decreases, that is, as the number of lenses included in the same area on the lens array 110 increases, the focal length of the lens element 111 may decrease, and the thickness of the imaging device 100 may decrease. Thus, a relatively thin camera may be implemented. In this example, the imaging device 100 may reconstruct a high-resolution output image by rearranging and combining low-resolution images captured by each lens element 111.

An individual lens element 111 of the lens array 110 may cover a predetermined sensing region 129 of the sensing array 121 corresponding to its lens size. In the sensing array 121, the sensing region 129 covered by the lens element 111 may be determined according to the lens size of the corresponding lens element 111. The sensing region 129 may be a region on the sensing array 121, and rays of a predetermined range of FoV may reach the sensing region 129 after passing through the lens element 111. The size of the sensing region 129 may be expressed by a distance from the center of the sensing region 129 to an outermost point or a diagonal length. The light passing through the imaging optical lens may be received in the sensing region 129 corresponding to the imaging optical lens in the sensing array 121. That is, light passing through an individual lens element 111 may be incident to a corresponding individual sensing element of the sensing array 121 included in the sensing region 129.

Each of the sensing elements of the sensing array 121 may generate sensing information based on rays passing through lenses of the lens array 110. For example, the sensing element 121a may sense an intensity value of light received through the lens element 111 as the sensing information. The imaging device 100 may determine intensity information corresponding to an original signal related to points included in the FoV of the imaging device 100 based on the sensing information output from the sensing array 121, and reconstruct the captured image based on the determined intensity information. For example, an individual sensing element 121a of the sensing array 121 may be an optical sensing element configured with a complementary metal-oxide-semiconductor (CMOS) or a charge-coupled device (CCD).

Further, the sensing element 121a may generate a color intensity value corresponding to a desired color as the sensing information by sensing light passing through the color filter 122a. Each of the plurality of sensing elements constituting the sensing array 121 may be disposed to sense a color different from that sensed by a neighboring sensing element that is spatially adjacent thereto.

When the diversity of sensing information is sufficiently secured, and a full-rank relationship is formed between the original signal information corresponding to the points included in the FoV of the imaging device 100 and the sensing information, a captured image corresponding to the maximum resolution of the sensing array 121 may be derived. The diversity of sensing information may be secured based on parameters of the imaging device 100, such as the number of lenses included in the lens array 110 and the number of sensing elements included in the sensing array 121.

In a multi-lens array structure for imaging, the imaging optical lenses and the sensing array 121 may be disposed in a fractional alignment structure. For example, the fractional alignment structure may be a structure in which a sensing region 129 covered by an individual lens element 111 includes a non-integer number of sensing elements. Each sensing region 129 of the sensing array 121 may include, for example, four or more sensing elements. In another example, each sensing region 129 may include nine or more sensing elements.

If the lens elements included in the lens array 110 have the same lens size, the number of lens elements included in the lens array 110 and the number of sensing elements included in the sensing array 121 may be relatively prime. A proportion P/L of the number L of lens elements corresponding to one axis of the lens array 110 and the number P of sensing elements corresponding to one axis of the sensing array 121 may be determined to be a real number. The number of sensing elements covered by each of the lens elements may be equal to the number of pixel offsets corresponding to P/L. For example, the sensing region 129 of FIG. 1A may include 7/3=2.3 sensing elements along a horizontal axis and 11/3=3.67 sensing elements along a vertical axis. Further-more, the lens element 111 may cover a plurality of, for example, a non-integer number of, condensing microlenses 123a. Thus, the number of condensing microlenses 123a in the image sensor 120 may be equal to the number of sensing elements 121a of the sensing array 121, and the number of lens elements 111, for example, imaging optical lenses of the lens array 110 may be less than the number of condensing microlenses.

Through the fractional alignment structure as described above, the imaging device 100 may have a slightly different arrangement of an optical center axis (OCA) of each lens element 111 with respect to the sensing array 121. That is, the lens element 111 may be eccentric with respect to the sensing element 121a. For example, at least one sensing element of the sensing array 121 may receive rays passing through different imaging optical lenses. Referring to the example of FIG. 1B, the fourth sensing element from the left may receive rays passing through the left lens element 111 and the middle lens element. Thus, each lens element 111 of the lens array 110 may receive different light field information. A light field (LF) may be emitted from a predetermined target point, and may be a field indicating directions and intensities of rays reflected at a predetermined point on a subject. The light field information may be information in which a plurality of light fields are combined. Since the direction of a chief ray of each lens element 111 also changes, each sensing region 129 receives different light field information. Thus, the imaging device 100 may optically obtain more sensing information. For sensing regions respectively corresponding to a plurality of imaging optical lenses, the image sensor 120 may sense intensity values of light reaching sensing elements belonging to the corresponding sensing regions. A processor of the image sensor 120 may reconstruct images, for example, a plurality of low-resolution images, respectively corresponding to the plurality of imaging optical lenses based on the sensed intensity values. Accordingly, the imaging device 100 may acquire a plurality of low-resolution input images through a variety of sensing information obtained as described above, and reconstruct a higher-resolution output image from the low-resolution input images.

Figure 2:
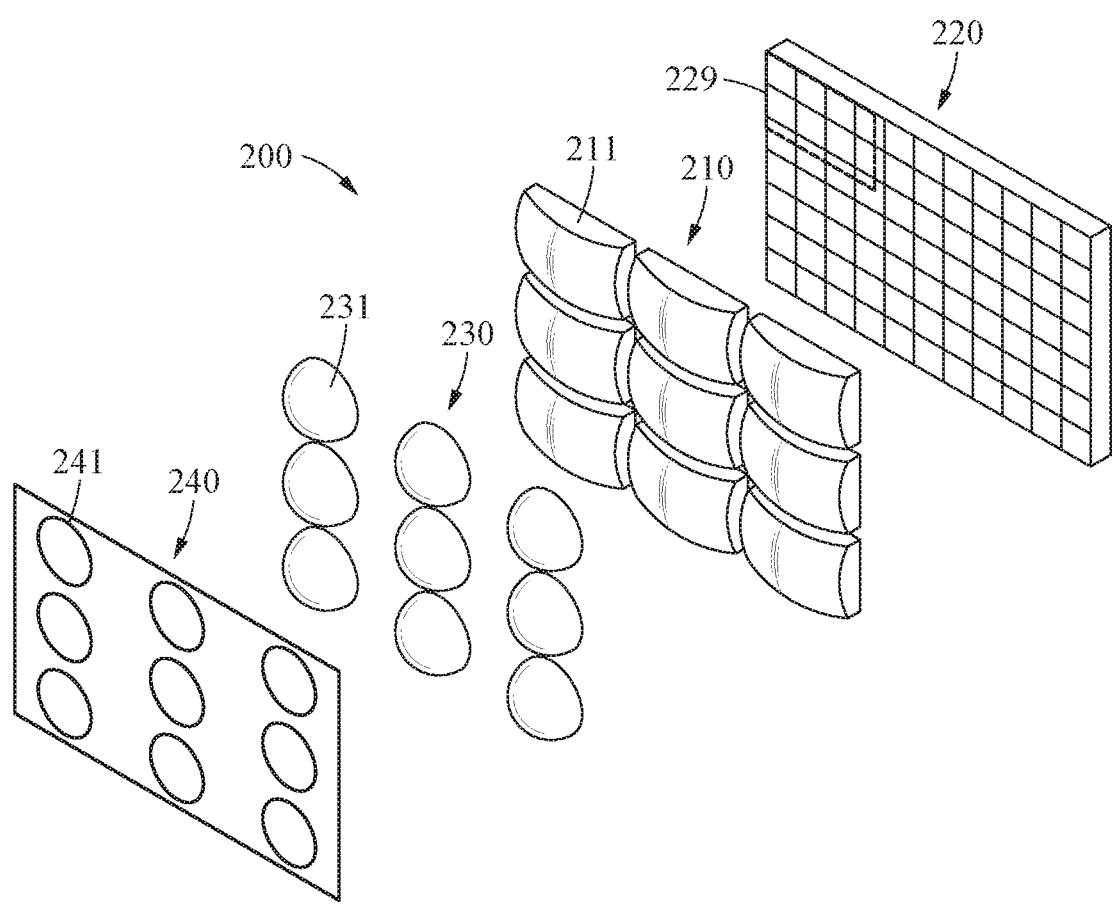
FIG. 2 illustrates a structure of an imaging device according to an exemplary embodiment.

FIG. 2 illustrates a structure of an imaging device according to an exemplary embodiment.

Referring to FIG. 2, an imaging device 200 may include an imaging lens array 210, a sensing array 220, an additional lens array 230, and an opening 240. FIG. 2 illustrates only the sensing array 220, but example embodiments are not limited thereto, and the other sensing elements of FIGS. 1A and 1B may be included. For example, the optical filter 122 and the condensing lens array 123 may further be disposed between the sensing array 220 and the imaging lens array 210.

The imaging lens array 210 may include optical lens elements for imaging. A lens element 211 may also be referred to as an imaging optical lens, and the f-number of the imaging device 200 may be set by a focal length f of the imaging optical lens 211. The imaging lens array 210, the imaging optical lens 211, the sensing array 220, and a sensing region 229 are respectively the same as and/or similar to the lens array 110, the lens element 111, the sensing array 121, and the sensing region 129 of FIGS. 1A and 1B.

The opening 240 may include a plurality of apertures. An aperture 241 may be, for example, in a circular shape and transmit light. For example, the plurality of apertures may be formed along a plane corresponding to the opening 240. The plurality of apertures may be formed to have a circular cross-section perpendicular to an optical axis by being filled with a transparent material. However, exemplary embodiments are not limited thereto. Rays passing through the plurality of apertures may be transmitted to subsequent optical elements corresponding to the apertures 241. In FIG. 2, a ray passing through the aperture 241 of the opening 240 may be transmitted to an additional lens 231 of the additional lens array 230.

The additional lens array 230 may include a plurality of additional lenses 231. The plurality of additional lenses 231 may be disposed along a virtual plane corresponding to the additional lens array 230. Each of the plurality of additional lenses 231 included in the additional lens array 230 may transmit a ray received from a previous layer, for example, the opening 240 of FIG. 2 to a subsequent layer, for example, the imaging lens array 210 of FIG. 2.

For reference, FIG. 2 illustrates each of the imaging lens array 210 and the additional lens array 230, respectively, as a single layer. However, exemplary embodiments are not limited thereto. The imaging device 200 may also include a plurality of imaging lens arrays 210 and a plurality of additional lens arrays 230. Here, the imaging lens array 210 may be a lens array configured to finally form an image and be provided closer to the sensing array 220 than the additional lens array 230, among the lens arrays, and the imaging lens array 210 and the sensing array 220 may face each other. If the condensing lens array 123 of FIG. 1 is disposed on the sensing array 220, the condensing lens array 123 may be closest to the sensing array 220, and the imaging lens array 210 may be next, for example, second) closest to the sensing array 220.

Herein, the imaging lens array 210 and the additional lens array 230 may be referred to as optical lens arrays. One of the imaging lens array 210 may be closer to the condensing lens array 123 than all the other optical lens arrays. An area proportion of the non-circular imaging optical lens 211 to the sensing region 229 of the imaging lens array 210 closest to the image sensor 120 may be greater than an area proportion of a circular lens to the sensing region 229. Thus, an optical power required for a ray passing through an outer portion of the non-circular imaging optical lens 211 to reach an outer portion of the sensing region 229 may decrease. That is, an optical error at the outer portion of the non-circular imaging optical lens 211 may decrease.

Hereinafter, a description will be provided based on optical elements through which a predetermined ray passes, on an optical path along which the ray reaches a sensing array from the aperture 241. For example, the structure and arrangement of the aperture 241, the additional optical lens 231, the imaging optical lens 211, and the sensing region 229 will be described, and the description may also apply to the remaining optical elements of each array similarly.

Figure 3:
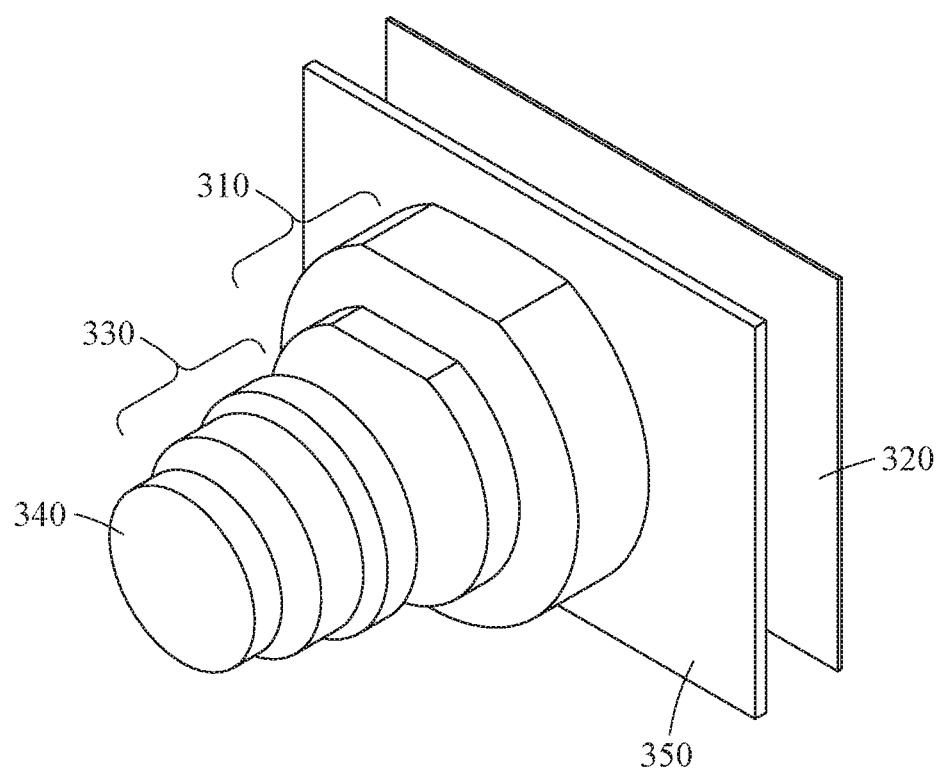
FIG. 3 illustrates an example of shapes of lenses included in an imaging device according to an exemplary embodiment.

FIG. 3 illustrates an example of shapes of lenses included in an imaging device according to an exemplary embodiment.

Referring to FIG. 3, in an imaging device, optical elements may be disposed in an order of an aperture 340, an additional optical lens 330, and an imaging optical lens 310. As shown in FIG. 3, there may be provided a plurality of additional optical lenses 330 and a plurality of imaging optical lenses 310.

The aperture 340 may transmit light. The aperture 340 and a sensing array 320 may be disposed on opposite sides with respect to the imaging optical lens 310.

The imaging optical lens 310 may have a non-circular cross-section perpendicular to a principal axis of the imaging device and transmit light received from the outside to the sensing array 320. The imaging optical lens 310 may have a non-circular cross-section, thereby covering a larger sensing region. The imaging optical lens 310 may form an image on a plane of the sensing array 320 by refracting light received from a subject. The cross-section of the imaging optical lens 310 will be described below with reference to FIGS. 4 through 5E.

The additional optical lens 330 may have one of a circular cross-section and a non-circular cross-section perpendicular to the principal axis, and may be disposed between the aperture 340 and the imaging optical lens 310 such that the additional optical lens 330 and the sensing array 320 may be disposed on opposite sides with respect to the imaging optical lens 310. FIG. 3 illustrates the additional optical lens 330 being a circular lens. However, exemplary embodiments are not limited thereto. For example, if there are a plurality of additional optical lenses 330, a portion of the plurality of additional optical lenses 330 may be circular lenses, and the remaining portion thereof may be non-circular lenses.

As described above, the sensing array 320 may include a plurality of sensing elements, and sense light passing through the imaging optical lens 310 using sensing elements in a sensing region.

The imaging device may further include an optical filter 350. The optical filter 350 may be disposed between the imaging optical lens 310 and the sensing array 320 and filter out a portion of wavelengths of the light passing through the imaging optical lens 310. For example, the optical filter 350 of FIG. 3 may be an infrared filter that blocks light having a wavelength of an infrared band and transmits light of a visible light band. The optical filter 350 of FIG. 3 may be different from the optical filter 122 in the image sensor 120 of FIGS. 1A and 1B.

According to an exemplary embodiment, another imaging lens may not be disposed between the imaging optical lens 310 and an image sensor including the sensing array 320. For example, if the imaging device includes a plurality of lenses such as the additional optical lens 330 and the imaging optical lens 310, the imaging optical lens 310 facing the sensing array 320 may be a lens closer to the sensing array 320 than the additional optical lens 330 is.

Figure 4:
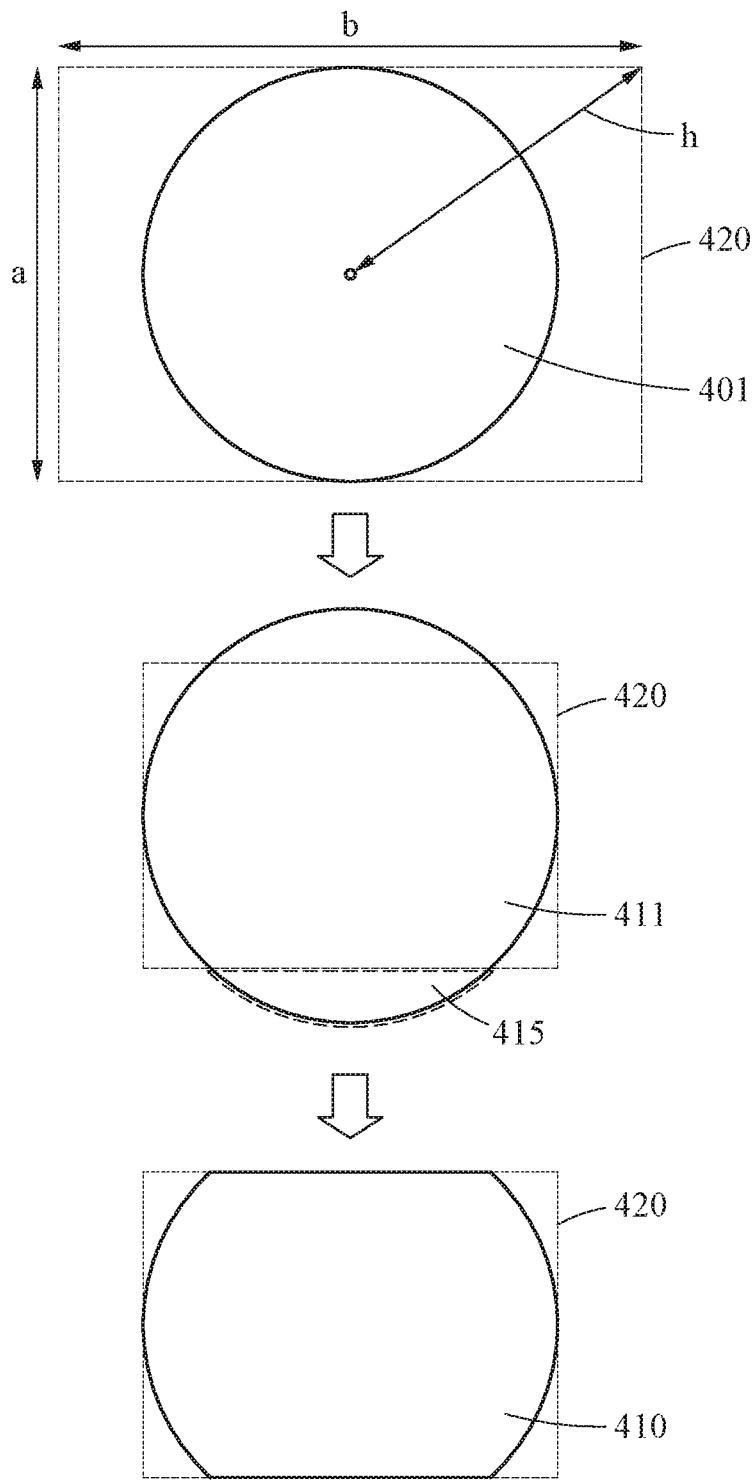
FIG. 4 illustrates a non-circular imaging optical lens included in an imaging device according to an exemplary embodiment.

FIG. 4 illustrates a non-circular imaging optical lens included in an imaging device according to an exemplary embodiment.

In FIG. 4, front views of a single imaging optical lens 410 of a lens array and a sensing region 420 corresponding to the imaging optical lens 410 in a sensing array are illustrated.

The sensing region 420 may be rectangular. For example, in FIG. 4 illustrates the length a of a short side of the rectangular sensing region 420, and the length b of a long side of the rectangular sensing region 420, and the length h from the center of the rectangular sensing region 420 to a vertex of the rectangular sensing region 420, for example, the diagonal half-length, and the diagonal length 2h of the sensing region 420. Each of a, b, h, and 2h may be expressed in units of length, for example, millimeter (mm), micrometer (nm), and nanometer (nm).

A circular lens 401 configured to be smaller than the sensing region 420 covers only a portion of the sensing region 420, and thus light received from the outside may not reach the remaining portion of the sensing region 420 not covered by the circular lens 401. Further, if the circular lens 401 is configured to transmit light to the remaining portion of the sensing region 420 not covered by the circular lens 401, optical aberration may occur due to excessive refraction at the outer portion of the circular lens 401.

The imaging optical lens 410 according to an exemplary embodiment may be a lens left after cutting off a portion of a circular lens 411 with a diameter greater than the length a of a short side of the rectangular sensing region 420. For example, the imaging optical lens 410 may be a lens left after cutting off a portion 415 of the circular lens 411 with a diameter greater than the length a of the short side of the rectangular sensing region 420, the portion being outside of the sensing region 420 corresponding to the imaging optical lens 410. Thus, the cross-section of the imaging optical lens 410 may correspond to a portion of a circle with a diameter greater than the length a of the short side of the rectangular sensing region 420. Hereinafter, various shapes of the imaging optical lens 410 will be described with reference to FIGS. 5A through 5E.

FIGS. 5A through 5E illustrate examples of shapes of a non-circular imaging optical lens according to an exemplary embodiment.

Herein, an imaging optical lens 511, 512, 513, 514, 515 may be a lens left after cutting off a portion of a circular lens as described in FIG. 4, and may be a non-circular lens. The cross-section of the imaging optical lens 511, 512, 513, 514, 515 may be determined according to the shape of a sensing region 520. The diameter of the imaging optical lens 511, 512, 513, 514, 515 may be the diameter of the circular lens before the cutoff. The radius of the circular lens may be denoted by Lh. The length from the center of the imaging optical lens 511, 512, 513, 514, 515 to a long side of the sensing region 520 may be denoted by Lh'.

Figure 5A:
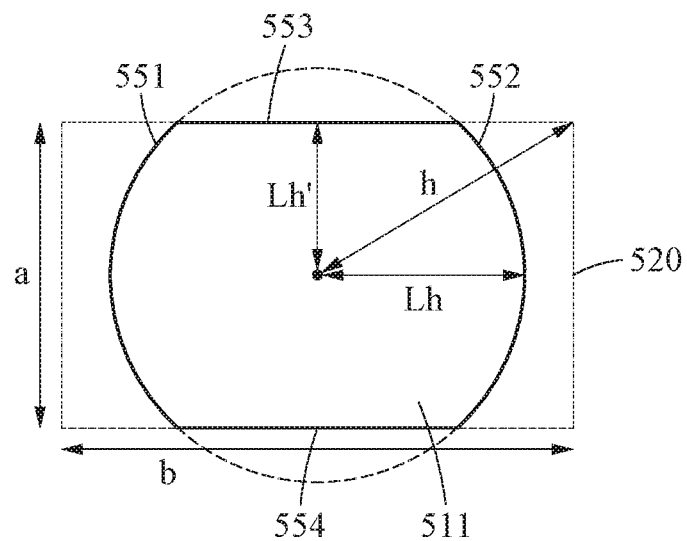
FIGS. 5A through 5E illustrate examples of shapes of a non-circular imaging optical lens according to an exemplary embodiment.

FIG. 5A illustrates an example in which the diameter of the imaging optical lens 511 is longer than the length a of the short side of the sensing region 520 and shorter than the length b of the long side of the sensing region 520. The cross-section of the imaging optical lens 511 may include two facing arcs 551 and 552 and straight lines 553 and 554 respectively connecting ends of one arc to ends of the other arc. In the cross-section, the first straight line 553 may connect a first end of the first arc 551 to a first end of the second arc 552. The second straight line 554 may connect a second end of the first arc 551 to a second end of the second arc 552.

Figure 5B:
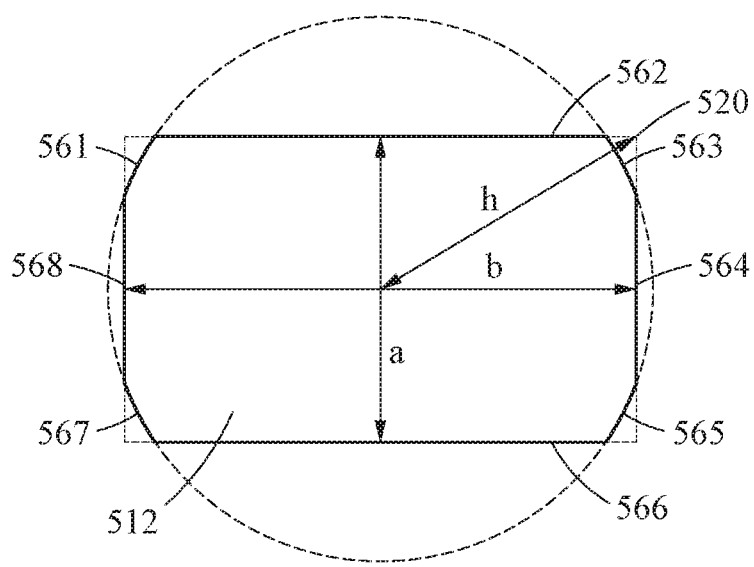

FIG. 5B illustrates an example in which the diameter of the imaging optical lens 512 is longer than the length b of the long side of the sensing region 520 and shorter than the diagonal length 2h. In addition to the upper end and the lower end of the circular lens, both side portions of the circular lens are outside of the sensing region 520 and thus, may be cut off. The imaging optical lens 512 may include four arcs 561, 563, 565, and 567 and straight lines 562, 564, 566, and 568 connecting the four arcs. The first arc 561 and the third arc 565 may face each other, and the second arc 563 and the fourth arc 567 may face each other. The first straight line 562 may connect the first arc 561 to the second arc 563. The second straight line 564 may connect the second arc 563 to the third arc 565. The third straight line 566 may connect the third arc 565 to the fourth arc 567. The fourth straight line 568 may connect the fourth arc 567 to the first arc 561. The first straight line 562 and the third straight line 566 may be parallel with each other, and the second straight line 564 and the fourth straight line 568 may be parallel with each other. The first straight line 562 and the third straight line 566 may be perpendicular to the second straight line 564 and the fourth straight line 568.

Figure 5C:
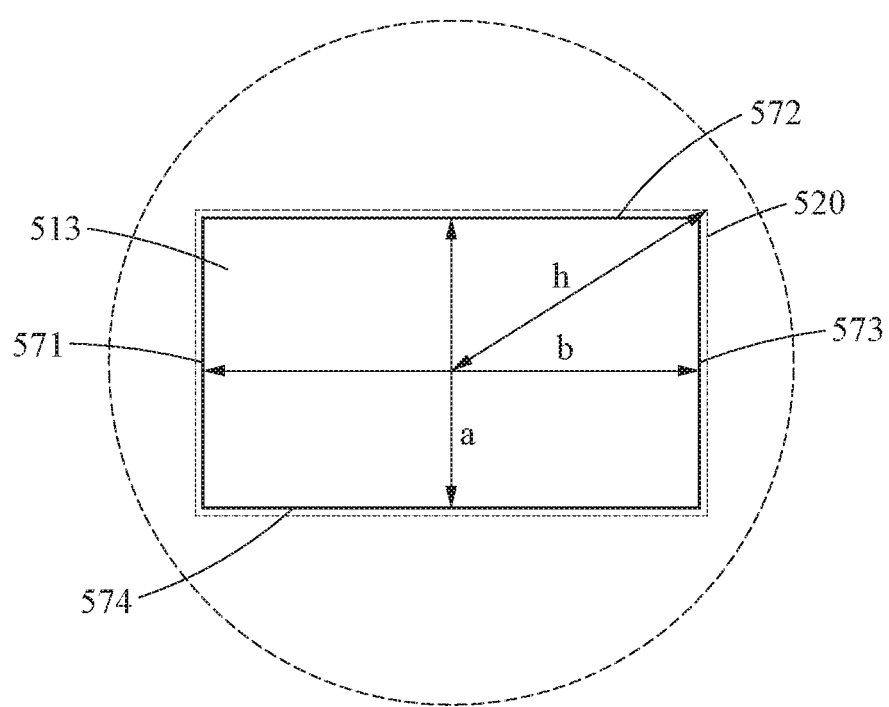

FIG. 5C illustrates an example in which the diameter of the imaging optical lens 513 is greater than or equal to the diagonal length 2h of the sensing region 520. The cross-section of the imaging optical lens 513 may correspond to a portion of a circle with a diameter greater than or equal to the diagonal length 2h of the sensing region 520. The cross-section of the imaging optical lens 513 left after cutting off a portion of the circular lens described above may be quadrangular. In the cross-section of the imaging optical lens 513, a first straight line 571 and a third straight line 573 may be parallel with each other, and a second straight line 572 and a fourth straight line 574 may be parallel with each other. Further, the first straight line 571 and the third straight line 573 may be orthogonal to the second straight line 572 and the fourth straight line 574.

The non-circular optical lens may have a predetermined cross-sectional area greater than or equal to that of the sensing region 520 facing the non-circular optical lens. FIG. 5C illustrates an example in which the area proportion of the non-circular optical lens 513 to the sensing region 520 is 1 as the maximum, and FIG. 5D illustrates an example in which the area proportion of the non-circular optical lens 514 to the sensing region 520 is the minimum.

Figure 5D:
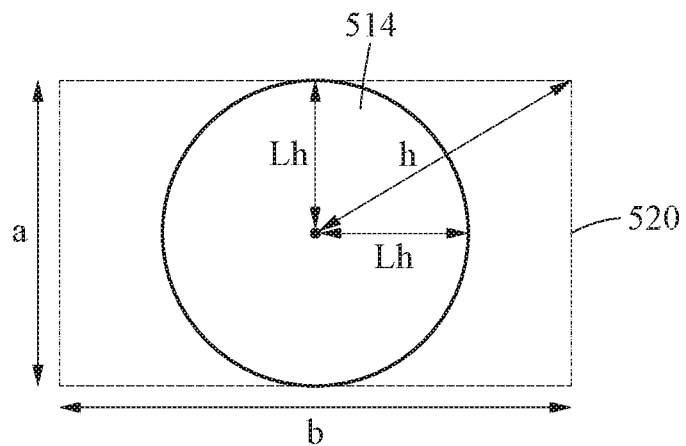

FIG. 5D illustrates a lens 514 with a diameter less than the minimum diameter of the non-circular the imaging optical lens 511 of FIG. 5A before the cutoff. That is, the diameter of the non-circular the imaging optical lens 511 needs to be greater than the diameter of the circular optical lens 514, that is, 2Lh (=a), and the area proportion of the non-circular optical lens to the sensing region needs to exceed the proportion calculated based on the circular optical lens 514. In the example of FIG. 5D, the ratio of the cross-sectional area of the optical lens to the sensing region 520 that it is facing, that is, the area proportion of the circular optical lens 514 to the area $S_{sensor}$ of the sensing region 520 may be expressed by Equation 1.

$$\frac{S_{Lens,min}}{S_{sensor}} = \frac{\pi}{4} \cdot \frac{a}{b} \qquad \text{[Equation 1]}$$

According to Equation 1, if the proportion of the long side to the short side of the sensing region 520 is b:a=1:1, the minimum area proportion may be $$\frac{\pi}{4}.$$

That is, according to FIGS. 5A through 5D, the proportion of the cross-sectional area of the non-circular imaging optical lens 511, 512, 513, 514 to the area of the sensing region 520 may be greater than 0.78 and less than or equal to 1. However, the area proportion described above may vary depending on the proportion of the long side to the short side of the sensing region 520. For example, if the proportion of the long side to the short side of the sensing region 520 is b:a=4:3, the proportion of the cross-sectional area of the non-circular imaging optical lens 511, 512, 513, 514 to the area of the sensing region 520 may be greater than 0.58 and less than or equal to 1. If the proportion of the long side to the short side of the sensing region 520 is b:a=16:9, the proportion of the cross-sectional area of the non-circular imaging optical lens 511, 512, 513, 514 to the area of the sensing region 520 may be greater than 0.44 and less than or equal to 1. If the proportion of the long side to the short side of the sensing region 520 is b:a=2:1, the proportion of the cross-sectional area of the non-circular imaging optical lens 511, 512, 513, 514 to the area of the sensing region 520 may be greater than 0.39 and less than or equal to 1. If the proportion of the long side to the short side of the sensing region 520 is b:a=4:1, the proportion of the cross-sectional area of the non-circular imaging optical lens 511, 512, 513, 514 to the area of the sensing region 520 may be greater than 0.19 and less than or equal to 1.

Figure 5E:
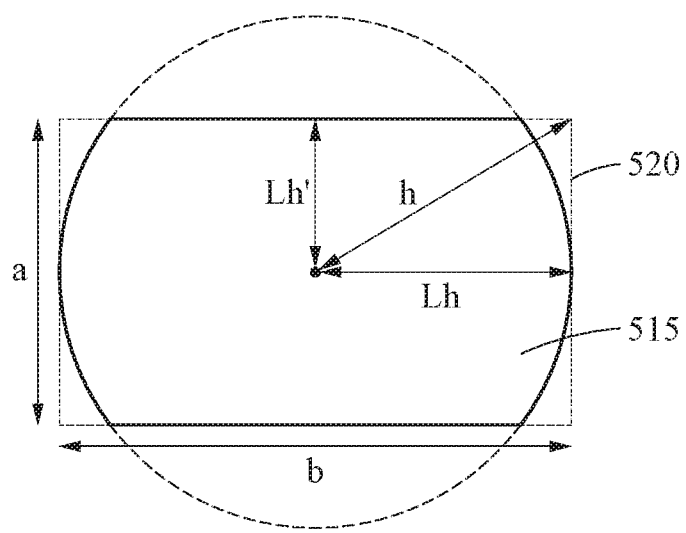

FIG. 5E illustrates a structure in which the diameter 2Lh of the imaging optical lens 515 is the same as the length of the long side b of the sensing region 520 in the range of size of the imaging optical lenses 511, 512, 513, and 514 described with reference to FIGS. 5A through 5D. The imaging optical lens 515 of FIG. 5E may cover all the sensing elements on one axis, for example, a horizontal axis passing through the center of the sensing region 520. In the structure of FIG. 5E, the proportion of the area $S_{Lens,med}$ of the imaging optical lens 515 to the area $S_{sensor}$ of the sensing region 520 may be expressed by Equation 2.

$$\frac{S_{Lens,med}}{S_{sensor}} = \frac{b}{2a}\left(\sin^{-1}\left(\frac{a}{b}\right) + \frac{a}{b}\cos\left(\sin^{-1}\left(\frac{a}{b}\right)\right)\right) \quad \text{[Equation 2]}$$

According to Equation 2, if the proportion of the long side to the short side of the sensing region 520 is b:a=4:3, the proportion of the cross-sectional area of the non-circular imaging optical lens 515 to the area of the sensing region 520 may be about 0.8961. Thus, the proportion of the cross-sectional area of the imaging optical lenses 515, 512, and 513 of FIGS. 5E, 5B, and 5C to the area of the sensing region 520 may be greater than or equal to 0.89 and less than or equal to 1. Similarly, if the proportion of the long side to the short side of the sensing region 520 is b:a=16:9, the proportion of the cross-sectional area of the non-circular imaging optical lens 511, 512, 513 to the area of the sensing region 520 may be greater than or equal to 0.94 and less than or equal to 1. If the proportion of the long side to the short side of the sensing region 520 is b:a=2:1, the proportion of the cross-sectional area of the non-circular imaging optical lens 511, 512, 513 to the area of the sensing region 520 may be greater than or equal to 0.95 and less than or equal to 1. If the proportion of the long side to the short side of the sensing region 520 is b:a=4:1, the proportion of the cross-sectional area of the non-circular imaging optical lens 511, 512, 513 to the area of the sensing region 520 may be greater than or equal to 0.98 and less than or equal to 1.

Figure 6:
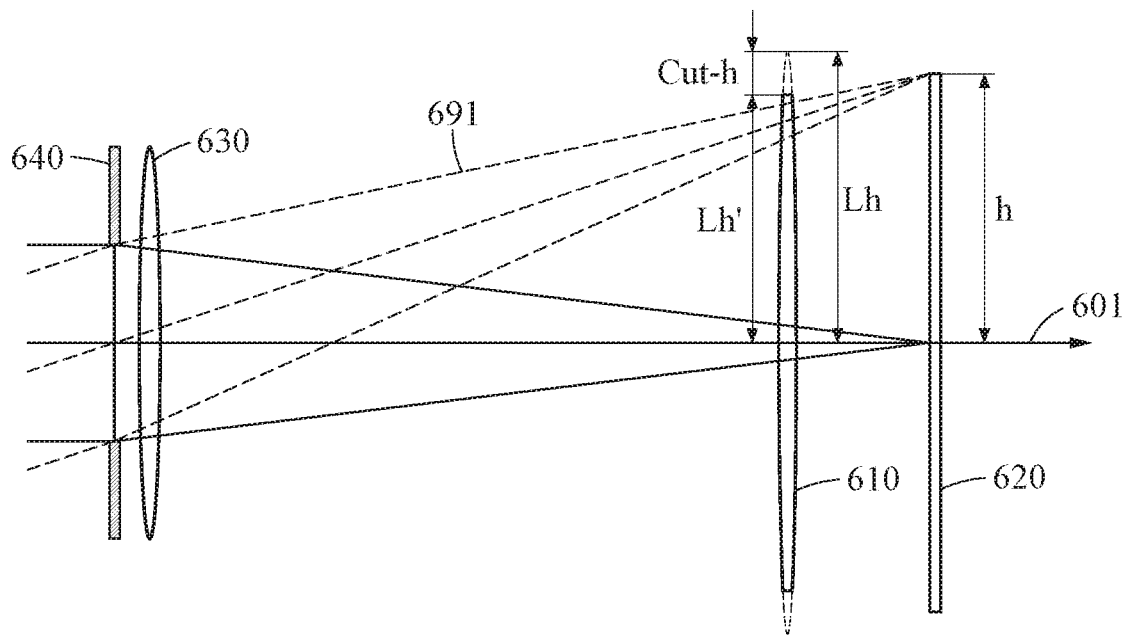
FIG. 6 illustrates a relationship between a vertical length of a non-circular imaging optical lens and a diagonal length of a sensing region according to an exemplary embodiment.

FIG. 6 illustrates a relationship between a vertical length of a non-circular imaging optical lens and a diagonal length of a sensing region according to an exemplary embodiment.

As shown in FIG. 6, a ray passing through an aperture of an opening 640 may be incident on a sensing array via an additional optical lens 630 and an imaging optical lens 610. The imaging optical lens 610 may intersect with virtual straight lines 691 from edge points of the aperture to a boundary of a sensing region 620. In a circular lens, portions not intersecting with the virtual straight lines 691 may be cut off. A vertical length Lh' which is based on an optical axis 601 in the imaging optical lens 610 may be less than the radius Lh of the circular lens by a cutoff length Cut-h. For example, the vertical length Lh' of the imaging optical lens 610 may be less than a diagonal half-length h based on the optical axis 601.

The cross-section of the imaging optical lens 610 left after cutting off a portion of the circular lens may be in the shapes as described in FIGS. 5A through 5C. However, exemplary embodiments are not limited thereto.

The imaging optical lens 610 left after cutting off a portion of the circular lens by the cutoff length Cut-h as described above may be disposed not to overlap another imaging optical lens corresponding to another sensing region in the sensing array. Further, since the imaging optical lens 610 intersects with a straight path from the aperture to the boundary of the sensing region 620, optical aberration and distortion may be minimized until a ray passing through the aperture passes through the imaging optical lens 610 and reaches the sensing region 620.

For reference, FIG. 6 only illustrates the vertical length Lh' of the non-circular imaging optical lens 610 and the diagonal half-length h of the sensing region on the same 2D plane to describe the length comparison. The real arrangement of the non-circular imaging optical lens 610 and the sensing array is not limited to the example of FIG. 6. For example, the imaging optical lens 610 and the sensing array may be disposed as shown in FIGS. 1 through 4.

Figure 7:
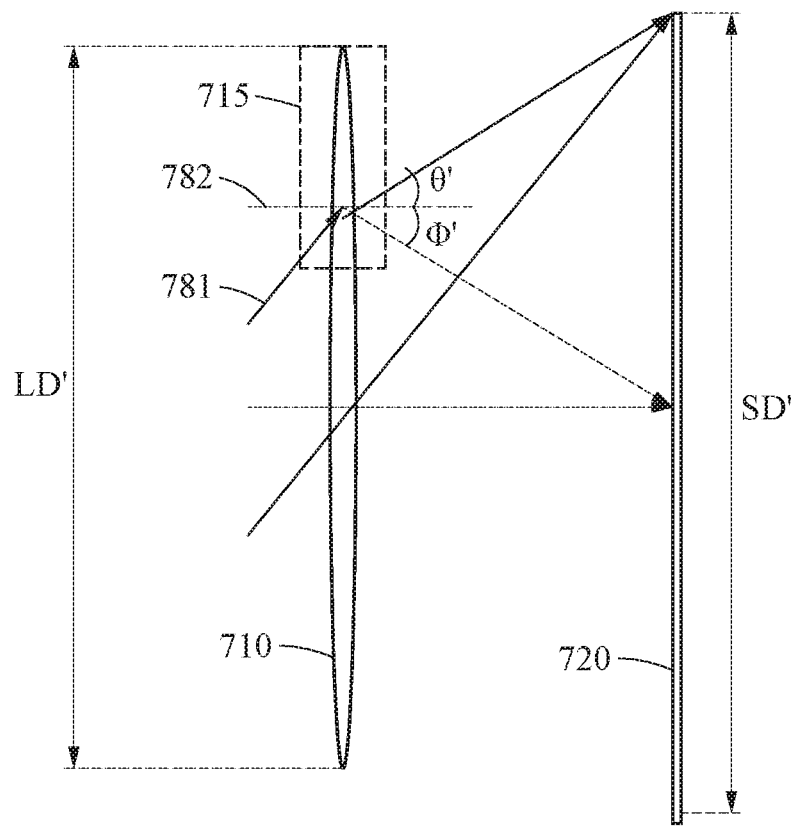
FIG. 7 illustrates optical paths of an imaging device according to an exemplary embodiment.

FIG. 7 illustrates optical paths of an imaging device according to an exemplary embodiment. FIG. 7 is a schematic top view of imaging of a chief ray and a marginal ray of an imaging optical lens 710.

The imaging optical lens 710 may be a lens left after cutting off a portion of a circular lens with a diameter LD' to the shapes shown in FIGS. 5A through 5C, and the diameter LD' of the circular lens may be the same as or similar to the diagonal length SD' of a sensing region.

Here, at an outer portion 715 of the imaging optical lens 710, a first refraction angle θ' of a first ray 781 incident along a path parallel with a virtual straight line from a center of the imaging optical lens 710 to a boundary of a sensing region 720 may be similar to a second refraction angle Φ' of a second ray 782 incident parallel with an optical axis of the imaging optical lens 710. The outer portion 715 may include, for example, points spaced apart from the center of the imaging optical lens 710 by the diagonal half-length h of the sensing region 720 and neighboring points thereof. The first ray 781 may be refracted by the outer portion 715 of the imaging optical lens 710 and reach the boundary of the sensing region 720. The second ray 782 may be refracted by the same outer portion 715 and reach the center of the sensing region 720, for example, a focal point. The image sensor may receive the first ray 781 at the boundary of the sensing region 720, the first ray 781 incident parallel with the virtual straight line from the center of the imaging optical lens 710 to the boundary of the sensing region 720 and refracted by the outer portion of the imaging optical lens 710 at the first refraction angle θ'. Further, the image sensor may receive the second ray 782 at the center of the sensing region 720, the second ray 782 incident parallel with the optical axis of the imaging optical lens 710 and refracted by the outer portion of the imaging optical lens 710 at the second refraction angle Φ'. As a difference between the first refraction angle θ' and the second refraction angle Φ' decreases, an imaging device may acquire an image of a subject with reduced optical aberration and distortion.

Further, a difference between a first light path along which the first ray 781 reaches the sensing array and a second light path along which the second ray 782 reaches the sensing array may be less than a threshold path difference. That is, in the imaging optical lens, a difference in optical path length (OPD) between light passing through a 0.0 field of the lens, for example, light toward the center of the sensing region and light passing through a 1.0 filed of the lens, for example, light toward the boundary of the sensing region may decrease. As the difference in OPD decreases, optical aberration and distortion may be reduced. For example, in a camera lens implemented on a smart phone, the maximum size of a half size of the lens in a 1.0 field and a 0.0 field may be 10 mm. Further, a difference in OPD between light passing through the 0.0 field and reaching a sensor and light passing through the 1.0 field and reaching the sensor may be within 10 mm.

Figure 8A:
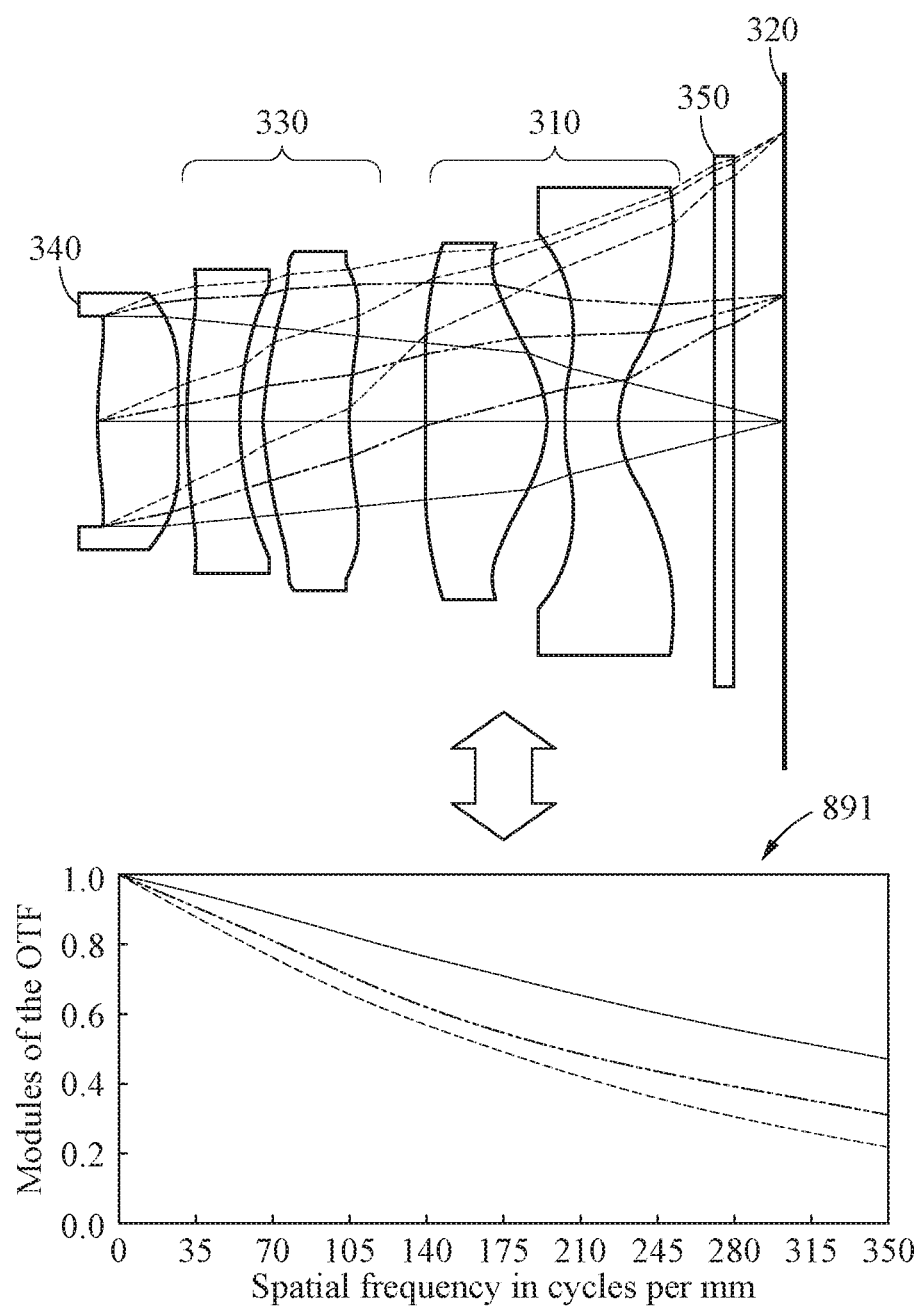
FIGS. 8A and 8B illustrate modulation transfer functions (MTFs) according to an exemplary embodiment.
Figure 8B:
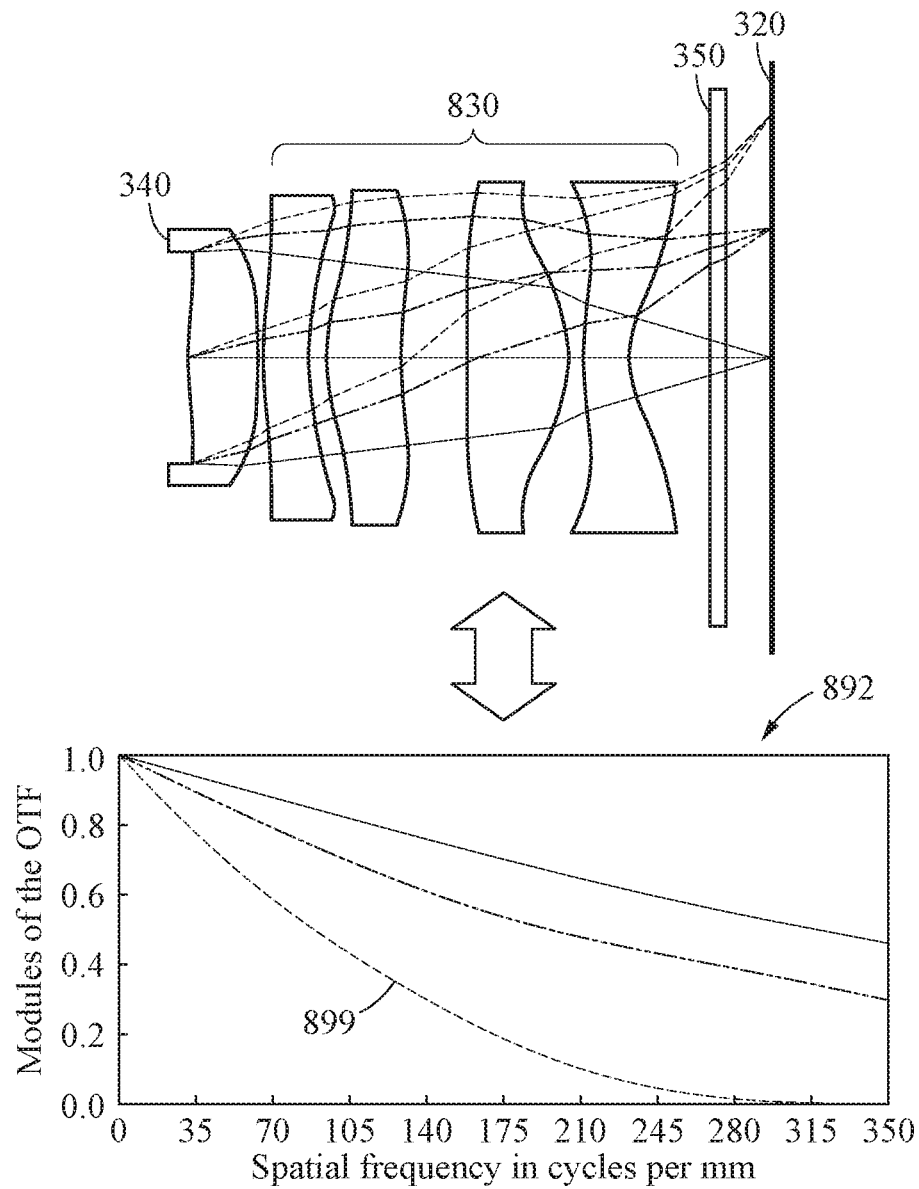

FIGS. 8A and 8B illustrate modulation transfer functions (MTFs) according to an exemplary embodiment.

FIG. 8A illustrates a side view of a structure of the imaging device of FIG. 3 and an MTF of the imaging device. FIG. 8B illustrates a side view of a structure of another imaging device including circular lenses 830 that is different from FIG. 3, and an MTF of the device. An MTF may be a type of index indicating an optical performance. In MTF graphs 891 and 892, a vertical axis may indicate an MTF value, and a horizontal axis may indicate a spatial frequency. In the MTF graphs 891 and 892, individual lines may indicate the transition of MTF values of rays incident to an aperture at a predetermined angle of incidence. The transition of the MTF values may be represented depending on a spatial frequency. The angle of incidence may be an angle about a vertical normal of a boundary surface of incidence.

In the structure of the imaging device of FIG. 8A, rays passing through the center of the aperture of the opening 340 and the boundary may pass through the additional optical lens 330, the imaging optical lens 310, and the optical filter 350 and reach the sensing region 320. In the structure of the device of FIG. 8B, rays passing through the aperture of the opening 340 may pass through the circular lenses 830 and the optical filter 350 and reach the sensing region 320. A ray vertically incident to the aperture may pass through a central portion of the imaging optical lens 310 at the rearmost end in the structure of the imaging device of FIG. 8A, and may pass through a central portion of the circular lens 830 at the rearmost end in the structure of the device of FIG. 8B. As the angle of incidence formed by the aperture and the ray increases, the ray may pass through a portion, for example, an outer portion farther away from the central portion of the imaging optical lens 310 at the rearmost end and a portion, for example, an outer portion farther away from the central portion of the circular lens 830 at the rearmost end.

The MTF does not greatly decrease even with respect to light passing through the outer portion of the imaging optical lens 310 as a ray with a great angle of incidence. Conversely, in the MTF graph 892 of the device of FIG. 8B, an MTF value 899 of light passing through the outer portion of the circular lens 830 as a ray with a great angle of incidence with respect to the aperture may be attenuated drastically as the spatial frequency increases. Thus, in the MTF graph 891 of the imaging device of FIG. 8A, an MTF with a stable value for each angle of incidence of a ray and for each spatial frequency may be represented.

Figure 9:
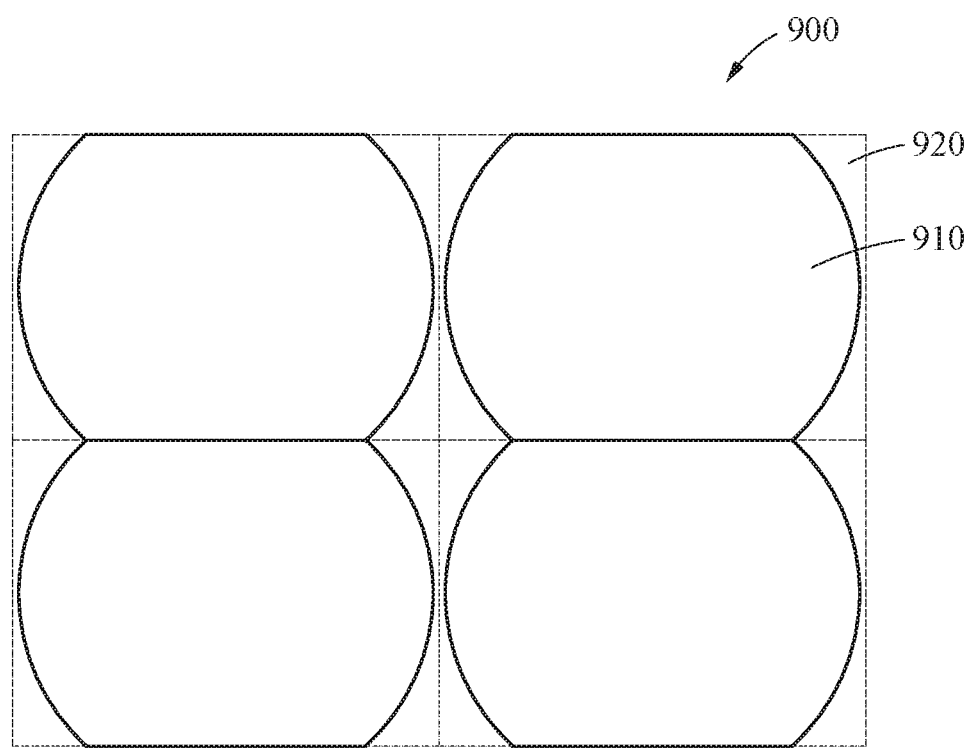
FIG. 9 illustrates a lens array including non-circular lenses in an imaging device according to an exemplary embodiment.

FIG. 9 illustrates a lens array including non-circular lenses in an imaging device according to an exemplary embodiment.

An imaging device may include, as an imaging array, a lens array 900 in which a plurality of non-circular imaging optical lenses are arranged. For example, the lens array 900 may include an imaging optical lens 910 and an additional imaging optical lens provided in the same shape and the same size as the imaging optical lens 910. The imaging optical lens 910 and the additional imaging optical lens may be disposed along the same plane. A sensing region 920 covered by the imaging optical lens 910 and a sensing region covered by the additional imaging optical lens may be the same in size and shape.

In FIG. 9, a structure in which the size of the sensing array is M×N (mm) and the lens array 900 includes 2×2 imaging optical lenses is illustrated. A sensing region occupied by each imaging optical lens 910 in the sensing array may be in the size of M/2×N/2.

Figure 10:
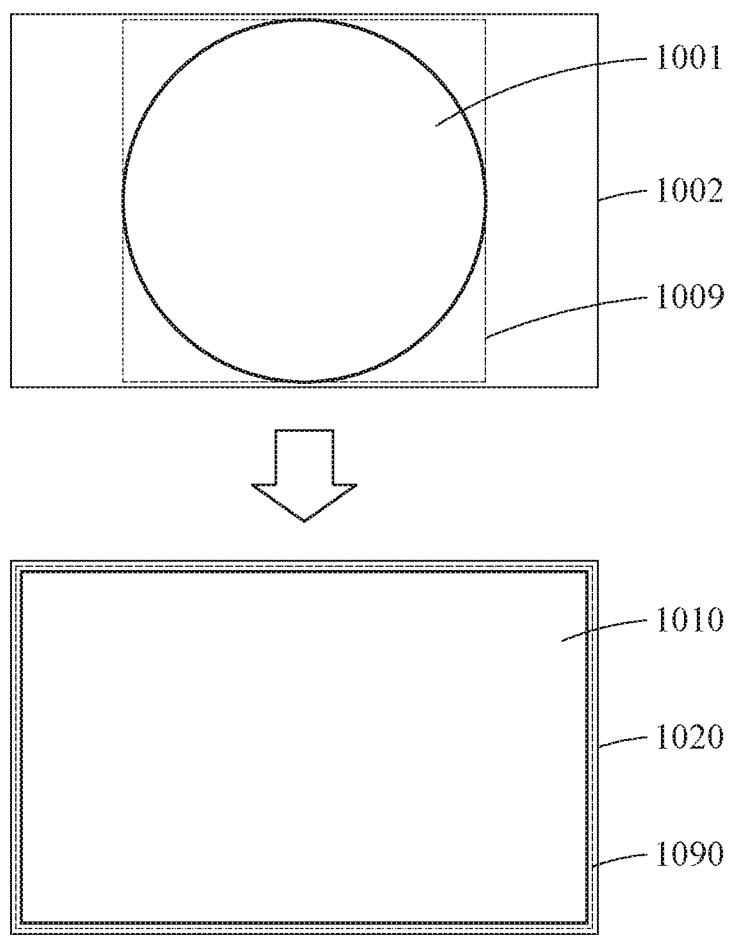
FIG. 10 illustrates a valid sensing region by a rectangular lens in an imaging device according to an exemplary embodiment.

FIG. 10 illustrates a valid sensing region by a quadrangular lens in an imaging device according to an exemplary embodiment.

A different valid sensing region may be available depending on the size of a lens in a sensing region of the same size. For example, if a circular imaging lens 1001 is used in a lens array, the lens may not protrude out of a sensing region 1002 allocated to each circular imaging lens 1001. Thus, the diameter of the circular imaging lens 1001 may be limited to the length of a short side of the sensing region or below. In this example, a valid sensing region 1009 of the circular imaging lens 1001 may be limited to a portion of the sensing region 1002, as shown in FIG. 10. For example, if the sensing array includes sensing elements supporting a resolution of up to 108.6M (12,032×9024), the resolution of the valid sensing region 1009 of the circular imaging lens 1001 may be limited to 81 M.

On the contrary, if a non-circular imaging lens is used as described with reference to FIGS. 1 through 9, a valid sensing region 1090 of the non-circular imaging lens 1010 may be substantially the same or similar to the sensing region 1020, and thus the resolution of the valid sensing region 1090 may be around 108M. When the non-circular imaging lens 1010 is disposed, the imaging device may use a full region of the sensing region 1020. Thus, the imaging device including the non-circular imaging lens 1010 may capture an image of an increased resolution with respect to the same sensing region 1020, when compared to the circular imaging lens 1001.

FIG. 10 illustrates a quadrangular lens as the non-circular imaging lens 1010, but exemplary embodiments are not limited thereto. The non-circular imaging lens 1010 may have a cross-section of a modified quadrangular shape, in addition to a rectangular cross-section and a square cross-section.

Figure 11:
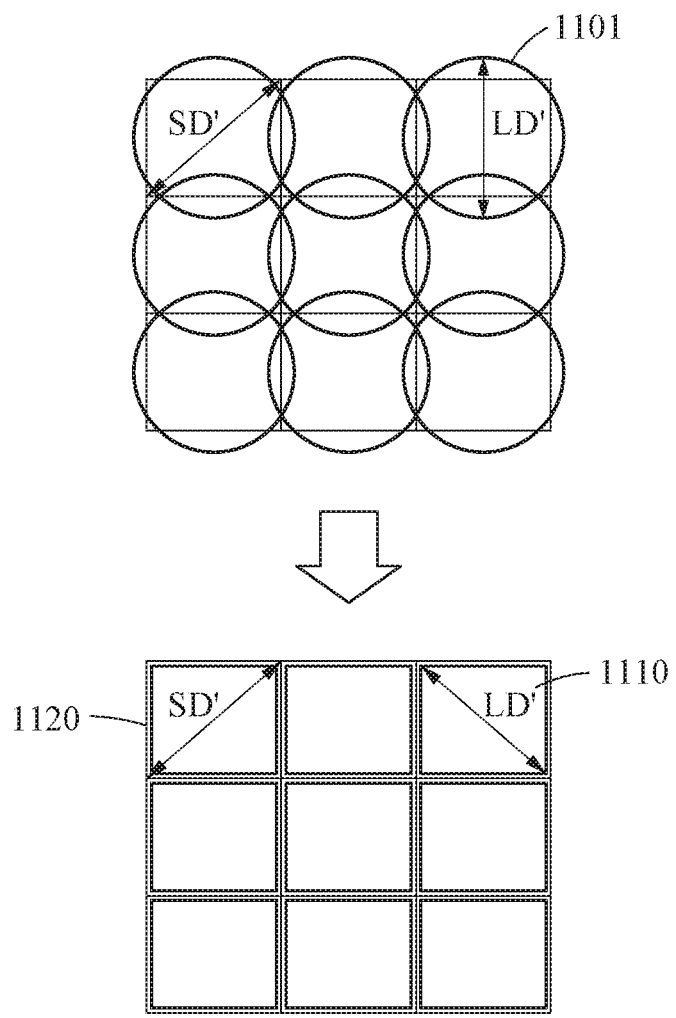
FIG. 11 illustrates a lens array including quadrangular lenses in an imaging device according to an exemplary embodiment.

FIG. 11 illustrates a lens array including quadrangular lenses in an imaging device according to an exemplary embodiment.

In a lens array in which lens elements are disposed along a plane in a grid pattern, if the diameter LD' of each circular lens 1101 is greater than or equal to the diagonal length SD' of an individual sensing region 1120, each circular lens 1101 may include regions overlapping other circular lenses 1101. Since lenses cannot overlap physically, a non-circular imaging optical lens 1110 may be provided in a shape left after cutting off a portion of the circular lens 1101 with the diameter LD' greater than or equal to the diagonal length SD' of the sensing region 1120. For example, portions of the circular lens 1101 overlapping other circular lenses 1101 may be cut off. As shown in FIG. 11, the non-circular imaging optical lens 1110 left after cutting off a portion of the circular lens 1101 with the diameter LD' greater than or equal to the diagonal length SD' of the sensing region 1120 may have a quadrangular cross-section. For reference, although FIG. 11 illustrates the lens array including non-circular imaging optical lenses 1110 each having a quadrangular cross-section perpendicular to an optical axis of the same shape, exemplary embodiments are not limited thereto. The shape of at least one imaging lens may be different from the shape of another imaging lens in the lens array.

As described above, since a full region of each sensing region 1120 may be covered by an imaging optical lens having a quadrangular cross-section, the lens performance may be maximized, and optical aberration may be reduced.

Thus, the imaging device may acquire an image of a subject with a more improved resolution.

Figure 12:
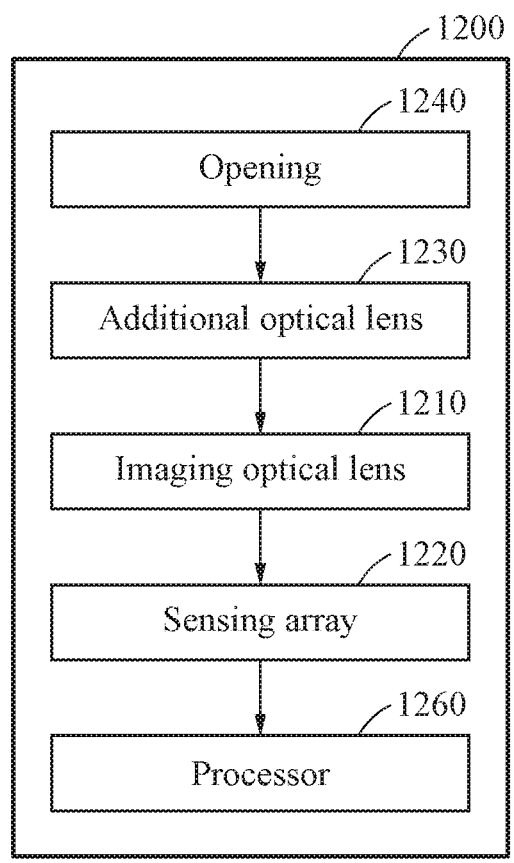
FIG. 12 is a block diagram illustrating a configuration of an imaging device according to an exemplary embodiment.
Figure 13:
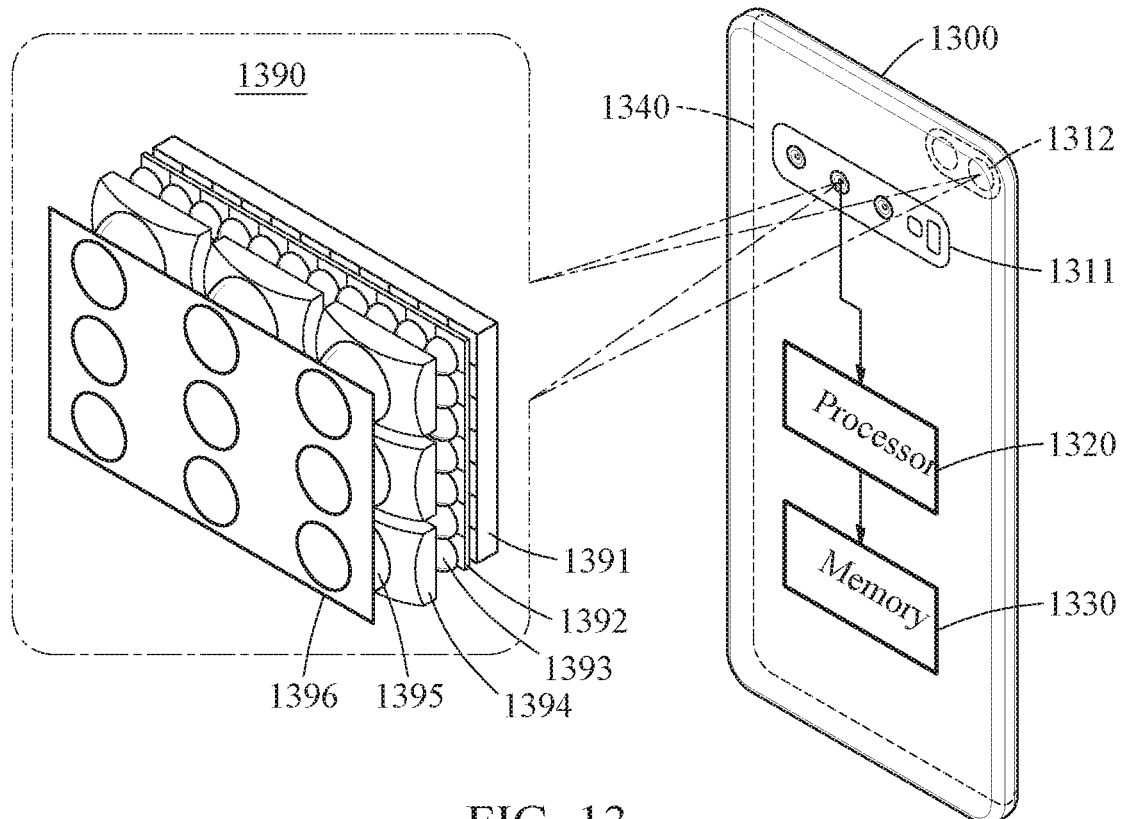
FIG. 13 illustrates a mobile terminal according to an exemplary embodiment.

FIG. 12 is a block diagram illustrating a configuration of an imaging device according to an exemplary embodiment. FIG. 13 illustrates a mobile terminal according to an exemplary embodiment.

Referring to FIG. 12, an imaging device 1200 may include an opening 1240, an additional optical lens 1230, an imaging optical lens 1210, a sensing array 1220, and a processor 1260. There may be provided N additional optical lenses 1230 and N imaging optical lens 1210. Here, N may be an integer greater than or equal to 2. The additional optical lens 1230 may be provided as at least one layer, and the imaging optical lens 1210 may be provided as at least one layer. The sensing array 1220 may include sensing elements configured to generate electrical signals by sensing light. The opening 1240, the additional optical lens 1230, the imaging optical lens 1210, and the sensing array 1220 are as described above with reference to FIG. 1 through 12. An assembly including the imaging optical lens 1210 and the sensing array 1220 may be an image sensing assembly. The image sensing assembly may further include one of an opening 1240, an additional optical lens 1230, the optical filter 122 as illustrated in FIGS. 1A and 1B, and the condensing lens array 123 as illustrated in FIGS. 1A and 1B, or a combination of two or more thereof, depending on the design, in addition to the imaging optical lens 1210 and the sensing array 1220.

The processor 1260 may obtain information related to a subject through the opening 1240, the additional optical lens 1230, and the imaging optical lens 1210 and reconstruct an image of the subject. For example, the processor 1260 may generate the image based on sensing information sensed by the sensing array 1220. The processor 1260 may acquire an image corresponding to an individual sensing region from sensing information sensed in the corresponding sensing region. The processor 1260 may acquire images as many as sensing regions constituting the sensing array 1220. The processor 1260 may reconstruct a single high-resolution image by rearranging and/or reconfiguring the images generated based on the sensing information. However, the operation of the processor 260 is not limited thereto.

The imaging device 1200 may be implemented as a mobile terminal 1300 shown in FIG. 13.

An image sensing assembly 1390 of the mobile terminal 1300 may be implemented in an ultra-thin structure through an image lens array 1394 including non-circular imaging optical lenses, for example, lenses having quadrangular cross-sections. The image sensing assembly 1390 may receive external light through the non-circular imaging optical lenses and generate sensing information by sensing the external light using a plurality of sensing elements. For example, the image sensing assembly 1390 may include a sensing array 1391, an optical filter 1392, a condensing lens array 1393, an imaging lens array 1394, an additional lens array 1395, and an opening 1396. The elements of the image sensing assembly 1390 are as described above with reference to FIG. 12, and thus a detailed description will be omitted for conciseness.

The image sensing assembly 1390 may be implemented as a smart phone camera, a DSLR camera, or a camera module for vision for vehicular/drone/CCTV recognition. For example, at least one of a rear camera 1311 and a front camera 1312 of the mobile terminal 1300 may be the image sensing assembly 1390. The rear camera 1311 may include a plurality of rear camera modules, and at least one of the plurality of rear camera modules may be the image sensing assembly 1390. Further, the front camera 1312 may include one or more front camera modules, and at least one of the one or more front camera modules may be the image sensing assembly 1390.

The rear camera 1311 and a display 1340 may be disposed on different sides, for example, on opposite sides, in a housing of the mobile terminal 1300. A rear side may be a side opposite the side on which the display 1340 is disposed in the mobile terminal 1300. The front camera 1312 and the display 1340 may be disposed on the same side in the housing of the mobile terminal 1300. A front side may be the side on which the display 1340 is disposed in the mobile terminal 1300.

The image sensing assembly 1390 of an ultra-thin structure may transmit light to the sensing array 1391 through the imaging lens array 1394, and the processor 1320 of the mobile terminal 1300 may acquire an image of a subject through the sensing array 1391. The processor 1320 may reconstruct an output image based on sensing information generated by the image sensing assembly 1390. For example, the processor 1320 may acquire as many images as a number of sensing regions constituting the sensing array 1391, as described with reference to FIG. 12. An input image acquired for each sensing region may be a relatively low-resolution image. The processor 1320 may reconstruct a single high-resolution output image with respect to the image sensing assembly 1390 by rearranging and/or reconfiguring images generated based on the sensing information. For reference, although FIG. 13 illustrates a single processor 1320, exemplary embodiments are not limited thereto. The mobile terminal 1300 may include a plurality of processors, and at least one processor 1320 among the plurality of processors may perform image processing with respect to the sensing information sensed by the image sensing assembly 1390.

The memory 1300 may store at least one of the sensing information and the output image. For example, the memory 1330 may temporarily or permanently store data required or computed by the processor 1320 during a process of reconstructing the high-resolution output image from the sensing information.

Figure 14:
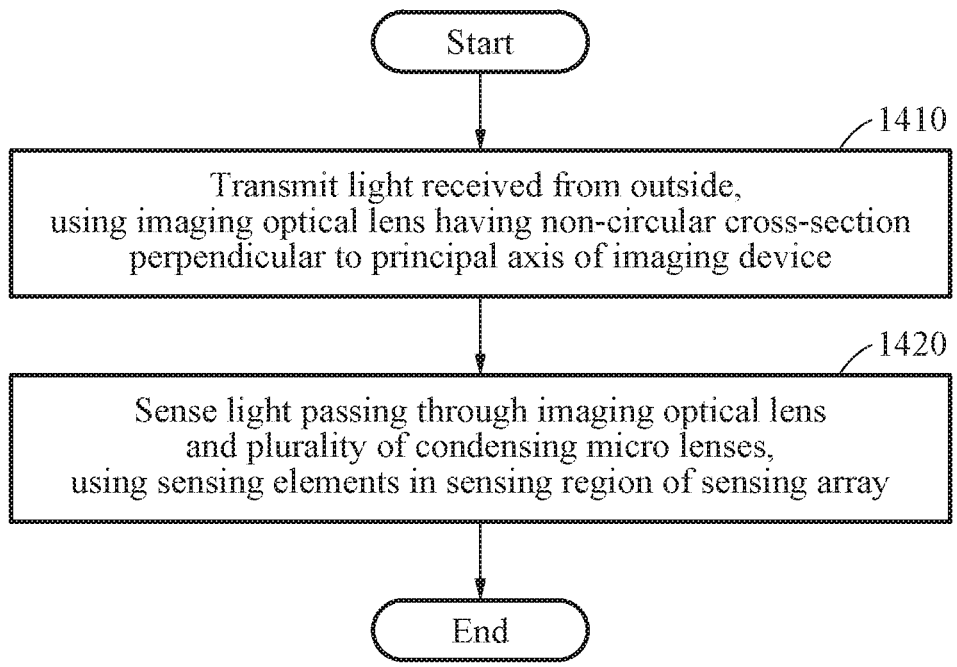
FIG. 14 is a flowchart illustrating an image sensing method according to an exemplary embodiment.

FIG. 14 is a flowchart illustrating an image sensing method according to an exemplary embodiment.

First, in operation 1410, an imaging device may transmit light received from the outside to a sensing array through an imaging optical lens having a non-circular cross-section perpendicular to a principal axis of the imaging device.

In operation 1420, the imaging device may sense the light passing through the imaging optical lens using sensing elements in a sensing region of a sensing array.

However, the image sensing method is not limited to the above description, and may be performed concurrently in parallel and/or sequentially with at least one of the operations described above with reference to FIGS. 1 through 12.

The units described herein may be implemented using a hardware component, a software component and/or a combination thereof. A processing device may be implemented using one or more general-purpose or special purpose computers, such as, for example, a processor, a controller and an arithmetic logic unit (ALU), a digital signal processor (DSP), a microcomputer, an field-programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular, however, one skilled in the art will appreciate that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described exemplary embodiments may be recorded in non-transitory computer-readable media including program instructions to implement various operations of the above-described exemplary embodiments. The media may also include, alone or in combination with the program instructions, data files, data structures, and the like. The program instructions recorded on the media may be those specially designed and constructed for the purposes of exemplary embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described exemplary embodiments, or vice versa.

Exemplary embodiments have been described above. Nevertheless, it should be understood that various modifications may be made to these exemplary embodiments. For example, suitable results may be achieved if the described techniques are performed in a different order and/or if components in a described system, architecture, device, or circuit are combined in a different manner and/or replaced or supplemented by other components or their equivalents.

While exemplary embodiments have been described with reference to the figures, it will be understood by those of ordinary skill in the art that various changes in form and details may be made therein without departing from the spirit and scope as defined by the following claims.

What is claimed is:

1. An imaging device comprising:
a sensing array comprising a plurality of sensing elements;
an imaging lens array comprising a plurality of imaging optical lenses, each of the plurality of imaging optical lenses having a non-circular cross-section perpendicular to an optical axis, and configured to transmit light received from an outside of the imaging device; and
a condensing lens array comprising a plurality of condensing lenses disposed between the imaging lens array and the sensing array, and configured to transmit the light passing through the imaging lens array to the sensing elements,
wherein a number of the plurality of imaging optical lenses is less than a number of the plurality of condensing lenses, and
wherein at an outer portion of each of the plurality of imaging optical lenses, a first refraction angle of a first ray incident parallel with a virtual straight line from a center of each of the plurality of imaging optical lenses to a boundary of a sensing region is equal to a second refraction angle of a second ray incident parallel with the optical axis of each of the plurality of imaging optical lenses.

2. The imaging device of claim 1, further comprising:
an additional optical lens array comprising a plurality of additional optical lenses, each of the plurality of additional optical lenses having one of a circular cross-section and a non-circular cross-section perpendicular to the optical axis, the additional optical lens array and the sensing array being respectively disposed on opposite sides of the imaging lens array.

3. The imaging device of claim 2, wherein the imaging lens array is disposed closer to the condensing lens array than the additional optical lens array.

4. The imaging device of claim 1, further comprising:
an aperture configured to transmit the light, the aperture and the sensing array being respectively disposed on opposite sides of the imaging lens array.

5. The imaging device of claim 1, wherein the sensing array comprises a sensing region that comprises a portion of the sensing elements of the plurality of sensing elements, the sensing region being configured to receive the light from the plurality of imaging optical lenses and being rectangular, and
wherein the cross-section of each of the plurality of imaging optical lenses corresponds to a portion of a circular lens having a diameter greater than a length of a short side of the rectangular sensing region.

6. The imaging device of claim 5, wherein each of the plurality of imaging optical lenses corresponds to the circular lens with a portion where the diameter of the circular lens is greater than the length of the short side of the rectangular sensing region being cut off.

7. The imaging device of claim 1, wherein each of the plurality of imaging optical lenses is configured to intersect with virtual straight lines from edge points of an aperture to a boundary of a sensing region.

8. The imaging device of claim 1, wherein a difference between a first light path along which the first ray reaches the sensing array and a second light path along which the second ray reaches the sensing array is less than a threshold path difference.

9. The imaging device of claim 1, further comprising:
a processor configured to generate an image based on sensing information sensed by the sensing array.

10. An imaging device comprising:
an imaging optical lens having a non-circular cross-section perpendicular to an optical axis, the imaging optical lens configured to transmit light received from an outside of the imaging device; and a sensing array comprising a plurality of sensing elements, the sensing array configured to sense the light passing through the imaging optical lens through a sensing element among the plurality of sensing elements included in a sensing region, wherein the imaging optical lens and the sensing array are disposed in a fractional alignment structure, and wherein at an outer portion of the imaging optical lens, a first refraction angle of a first ray incident parallel with a virtual straight line from a center of the imaging optical lens to a boundary of the sensing region is equal to a second refraction angle of a second ray incident parallel with the optical axis of the imaging optical lens.

11. The imaging device of claim 10, further comprising:
an additional optical lens having one of a circular cross-section and a non-circular cross-section perpendicular to the optical axis, the additional optical lens and the sensing array respectively being disposed on opposite sides of the imaging optical lens.

12. The imaging device of claim 11, wherein the imaging optical lens is closer to an image sensor comprising a condensing microlens and the sensing array than the additional optical lens.

13. The imaging device of claim 10, further comprising:
an aperture configured to transmit the light, the aperture and the sensing array being respectively disposed on opposite sides of the imaging optical lens.

14. The imaging device of claim 10, wherein the sensing array comprises a sensing region that comprises a portion of the sensing elements of the plurality of sensing elements, the sensing region being configured to receive the light from the imaging optical lens and being rectangular, and
wherein the cross-section of the imaging optical lens corresponds to a portion of a circular lens with a diameter greater than a length of a short side of the rectangular sensing region.

15. The imaging device of claim 14, wherein the imaging optical lens corresponds to the circular lens with a portion where the diameter of circular lens is greater than the length of the short side of the rectangular sensing region being cut off.

16. The imaging device of claim 14, wherein the portion is outside of the rectangular sensing region corresponding to the imaging optical lens.

17. The imaging device of claim 10, wherein the non-circular cross-section of the imaging optical lens comprises two arcs and two straight lines respectively connecting ends of the two arcs.

18. The imaging device of claim 10, wherein the non-circular cross-section of the imaging optical lens comprises four arcs and four straight lines respectively connecting ends of the four arcs.

19. The imaging device of claim 10, wherein the non-circular cross-section of the imaging optical lens corresponds to a portion of a circle with a diameter greater than or equal to a diagonal length of the sensing region.

20. The imaging device of claim 19, wherein the non-circular cross-section of the imaging optical lens is quadrangular.

21. The imaging device of claim 10, wherein the imaging optical lens is configured to intersect with virtual lines from edge points of an aperture to a boundary of the sensing region.

22. The imaging device of claim 10, wherein a difference between a first light path along which the first ray reaches the sensing array and a second light path along which the second ray reaches the sensing array is less than a threshold path difference.

23. The imaging device of claim 10, wherein a proportion of a cross-sectional area of the non-circular imaging optical lens to an area of the sensing region is greater than 0.78 and less than or equal to 1.

24. The imaging device of claim 10, wherein a proportion of the non-circular cross-sectional area of the imaging optical lens to an area of the sensing region is greater than 0.58 and less than or equal to 1.

25. The imaging device of claim 10, wherein a proportion of the non-circular cross-sectional area of the imaging optical lens to an area of the sensing region is greater than 0.44 and less than or equal to 1.

26. The imaging device of claim 10, wherein a proportion of the non-circular cross-sectional area of the imaging optical lens to an area of the sensing region is greater than 0.39 and less than or equal to 1.

27. The imaging device of claim 10, wherein a proportion of the non-circular cross-sectional area of the imaging optical lens to an area of the sensing region is greater than 0.89 and less than or equal to 1.

28. The imaging device of claim 10, further comprising:
a lens array comprising a plurality of non-circular imaging optical lenses.

29. The imaging device of claim 10, further comprising:
a processor configured to generate an image based on sensing information sensed by the sensing array.

30. The imaging device of claim 10, further comprising:
a lens array comprising an additional imaging optical lens having a same shape and a same size as the imaging optical lens,
wherein the imaging optical lens and the additional imaging optical lens are disposed along a same plane.

31. The imaging device of claim 10, wherein the fractional alignment structure is a structure in which the sensing region comprises a non-integer number of sensing elements.

32. An imaging device comprising:
an imaging lens array comprising a plurality of non-circular imaging optical lenses, each of the plurality of non-circular imaging optical lenses being configured to transmit light received from an outside of the imaging device; and
a sensing array comprising a plurality of sensing regions, each of the plurality of sensing regions configured to sense the light passing through the plurality of imaging optical lenses, the plurality of sensing regions each comprising a plurality of sensing elements,
wherein at an outer portion of each of the plurality of non-circular imaging optical lenses, a first refraction angle of a first ray incident parallel with a virtual straight line from a center of each of the plurality of non-circular imaging optical lenses to a boundary of each of the plurality of sensing regions is equal to a second refraction angle of a second ray incident parallel with the optical axis of each of the plurality of non-circular imaging optical lenses.

33. The imaging device of claim 32, wherein each of the plurality of sensing regions comprise four or more sensing elements.

34. The imaging device of claim 32, wherein each of the plurality of sensing regions comprise nine or more sensing elements.

35. The imaging device of claim 32, further comprising:
an aperture configured to transmit the light, the aperture and the sensing array respectively being disposed on opposite sides of the imaging lens array.

36. The imaging device of claim 32, further comprising: a filter disposed between the imaging lens array and the sensing array and configured to block a portion of wavelengths of the light passing therethrough.

37. The imaging device of claim 32, further comprising: an additional optical lens having one of a circular cross-section and a non-circular cross-section perpendicular to the optical axis of the imaging device, the additional optical lens and the sensing array being respectively disposed on opposite sides of the imaging lens array.

38. The imaging device of claim 32, further comprising: a processor configured to generate an image based on sensing information sensed by the sensing array.

39. The imaging device of claim 32, wherein a proportion of a cross-sectional area of the non-circular imaging optical lens to an area of the sensing elements ranges from 0.78 to 1.0.

40. The imaging device of claim 32, further comprising: a condensing lens array comprising a plurality of condensing lenses disposed between the imaging lens array and the sensing array, and configured to transmit the light passing through the imaging lens array to the sensing array.

41. The imaging device of claim 40, wherein a number of the plurality of condensing lenses is greater than a number of the plurality of non-circular imaging optical lenses.

42. A mobile terminal comprising:
an image sensing assembly configured to receive external light through a non-circular imaging optical lens and generate sensing information based on sensing the external light through a plurality of sensing elements, the imaging assembly further comprising a sensing region that comprises a plurality of sensing elements, the sensing region being configured to receive light from the non-circular imaging optical lens;
a processor configured to reconstruct an output image based on the sensing information; and
a memory configured to store at least one of the sensing information and the output image,
wherein at an outer portion of the imaging optical lens, a first refraction angle of a first ray incident parallel with a virtual straight line from a center of the imaging optical lens to a boundary of the sensing region is equal to a second refraction angle of a second ray incident parallel with the optical axis of the imaging optical lenses.

43. The mobile terminal of claim 42, wherein the image sensing assembly further comprises:
a plurality of condensing lenses disposed between the non-circular imaging optical lens and the plurality of sensing elements, and configured to transmit the light passing through the non-circular imaging optical lens to the plurality of sensing elements.

44. The mobile terminal of claim 43, wherein the non-circular imaging optical lens is disposed closest to the plurality of condensing lenses.

45. The mobile terminal of claim 42, wherein the sensing region being rectangular, and
wherein a cross-section of the non-circular imaging optical lens corresponds to a portion of a circle with a diameter greater than a length of a short side of the rectangular sensing region.

46. The mobile terminal of claim 45, wherein the non-circular imaging optical lens corresponds to a portion of a circular lens with the diameter greater than the length of the short side of the rectangular sensing region being cut off.

47. An imaging device comprising:
a sensing array comprising a plurality of sensing elements and a sensing region comprising a portion of the plurality of sensing elements;
an imaging lens array comprising a plurality of imaging optical lenses, each of the plurality of imaging optical lenses having a non-circular cross-section perpendicular to an optical axis, and configured to transmit light received from an outside of the imaging device;
a condensing lens array comprising a plurality of condensing lenses disposed between the imaging lens array and the sensing array, and configured to transmit the light passing through the imaging lens array to the sensing elements;
an additional optical lens array comprising a plurality of additional optical lenses and disposed on the imaging lens array opposite to the sensing array,
wherein the non-circular cross-section of each of the plurality of imaging optical lenses corresponds to a circular lens with a portion where a diameter of the circular lens is greater than a length of a short side of the rectangular sensing region being cut off, and
wherein at an outer portion of each of the plurality of imaging optical lenses, a first refraction angle of a first ray incident parallel with a virtual straight line from a center of each of the plurality of imaging optical lenses to a boundary of a sensing region is equal to a second refraction angle of a second ray incident parallel with the optical axis of each of the plurality of imaging optical lenses.

48. The image sensing method of claim 47, wherein a difference between a first light path along which the first ray reaches the boundary of the sensing region and a second light path along which the second ray reaches the center of the sensing region is less than a threshold path difference.

49. An image sensing method comprising:
receiving light passing through an imaging optical lens having a non-circular cross-section perpendicular to a principal axis in a sensing area corresponding to the imaging optical lens in a sensing array; and
generating sensing information related to the sensing region by sensing the light passing through the imaging optical lens,
wherein the receiving comprises:
receiving a first ray at a boundary of the sensing region, the first ray incident parallel with a virtual straight line from a center of the imaging optical lens to the boundary of the sensing region and refracted by an outer portion of the imaging optical lens at a first refraction angle; and
receiving a second ray at a center of the sensing region, the second ray incident parallel with an optical axis of the imaging optical lens and refracted by the outer portion of the imaging optical lens at a second refraction angle which is similar to the first refraction angle.

50. The image sensing method of claim 49, wherein the receiving comprises receiving rays passing through different imaging optical lenses by at least one sensing element of the sensing array.

51. The image sensing method of claim 49, wherein the generating comprises, for sensing regions respectively corresponding to a plurality of imaging optical lenses, sensing intensity values of light reaching sensing elements belonging to the corresponding sensing regions.

52. The image sensing method of claim 51, further comprising:
   reconstructing images respectively corresponding to the plurality of imaging optical lenses based on the sensed intensity values.

* * * * *